US006611081B1

(12) United States Patent
Okazaki et al.

(10) Patent No.: US 6,611,081 B1
(45) Date of Patent: Aug. 26, 2003

(54) VIBRATION ACTUATOR WITH TWO VIBRATION MODES

(75) Inventors: Mitsuhiro Okazaki, Tokyo (JP); Tomoaki Suzuki, Yamato (JP); Nobuyoshi Nasu, Yokohama (JP); Tadao Takagi, Yokohama (JP); Tsuyoshi Matsumoto, Tokyo (JP); Isao Sugaya, Kawasaki (JP); Tunemi Gonda, Yamato (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/658,760

(22) Filed: Sep. 8, 2000

(30) Foreign Application Priority Data

| Sep. 10, 1999 | (JP) | ............................................ 11-257872 |
| Sep. 14, 1999 | (JP) | ............................................ 11-259708 |
| Nov. 30, 1999 | (JP) | ............................................ 11-339514 |
| Apr. 7, 2000 | (JP) | ........................................ 2000-106960 |
| Apr. 21, 2000 | (JP) | ........................................ 2000-120296 |

(51) Int. Cl.[7] ............................. H01L 41/08; H02N 2/00
(52) U.S. Cl. ........................ 310/323.16; 310/323.01
(58) Field of Search ...................... 310/323.01, 323.16

(56) References Cited

U.S. PATENT DOCUMENTS

| 4,705,980 A | * 11/1987 | Mishiro .................. 310/323.19 |
| 5,008,581 A | 4/1991 | Kumada et al. ............. 310/323 |
| 5,140,215 A | * 8/1992 | Yamaguchi ................. 310/323 |
| 5,726,515 A | * 3/1998 | Tsukimoto et al. ......... 310/323 |
| 5,763,981 A | * 6/1998 | Okazaki et al. ............. 310/325 |
| 5,821,667 A | * 10/1998 | Takagi et al. ............... 310/317 |
| 5,892,316 A | * 4/1999 | Ashizawa et al. ..... 310/323.02 |
| 6,242,846 B1 | * 6/2001 | Ashizawa et al. ..... 310/323.02 |

FOREIGN PATENT DOCUMENTS

JP    2215629    8/1990

OTHER PUBLICATIONS

Teratani Akira, Feeding Structure For Ultrasonic Actuator, Jun. 25, 1980, Japanese Abstract No. 08–168276, Japan (Abstract).
Teratani Akira, Method For Driving Ultrasonic Motor, Jun. 24, 1994, Japanese Abstract No. 06–178558.
S. Ueha, et al., Ultrasonic Motors Theory and Applications, Clarendon Press·Oxford 1993, pp. 84–86 and pp. 215–221.

* cited by examiner

Primary Examiner—Lynn D. Feild
Assistant Examiner—Michael C. Zarroli

(57) ABSTRACT

A vibration actuator includes a vibration element, which simultaneously generates a radial symmetric expansion vibration mode in which it expands and contracts in the radial direction and a non-axisymmetric planar vibration mode in which it bends to and fro in a non-axisymmetric manner within a single plane, and thereby drives a relative movement member, and a base member to which the vibration element is fixed. The vibration element includes at least one superimposed layer structure comprising a pair of electrical energy to mechanical energy conversion elements and an elastic member sandwiched between the pair of electrical energy to mechanical energy conversion elements. The elastic member includes a ring shaped portion to both the sides of which the pair of electrical energy to mechanical energy conversion elements are stuck, and a cylindrical shaped support portion, formed integrally with the ring shaped portion, which fixes the vibration element to the base member. The support portion includes an elastic portion which suppresses the transmission of vibration generated by the vibration element to the base member.

28 Claims, 21 Drawing Sheets

A-A SECTIONAL VIEW

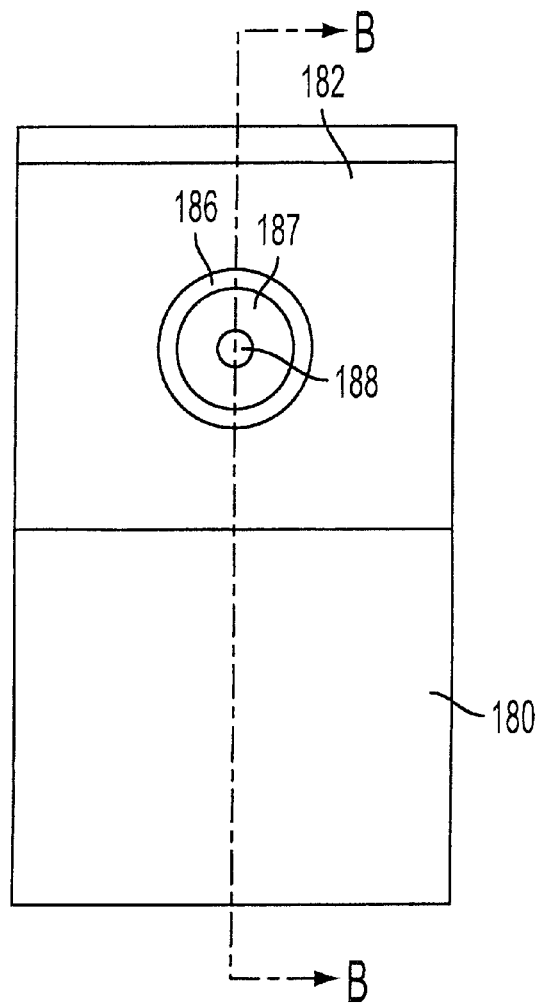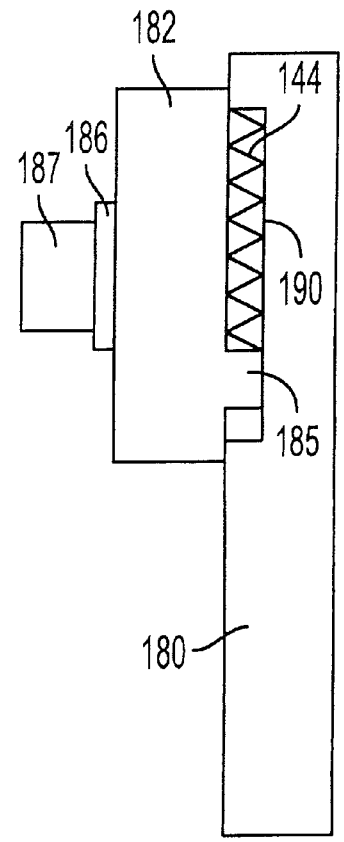
FIG. 15A FIG. 15B
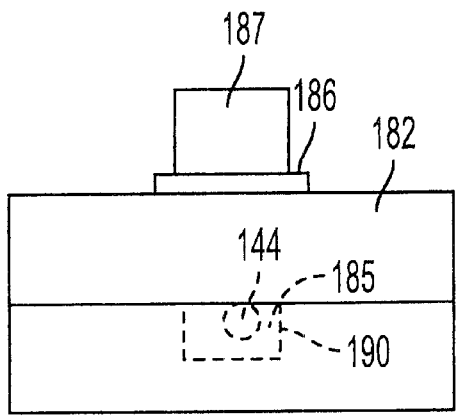
FIG. 15C

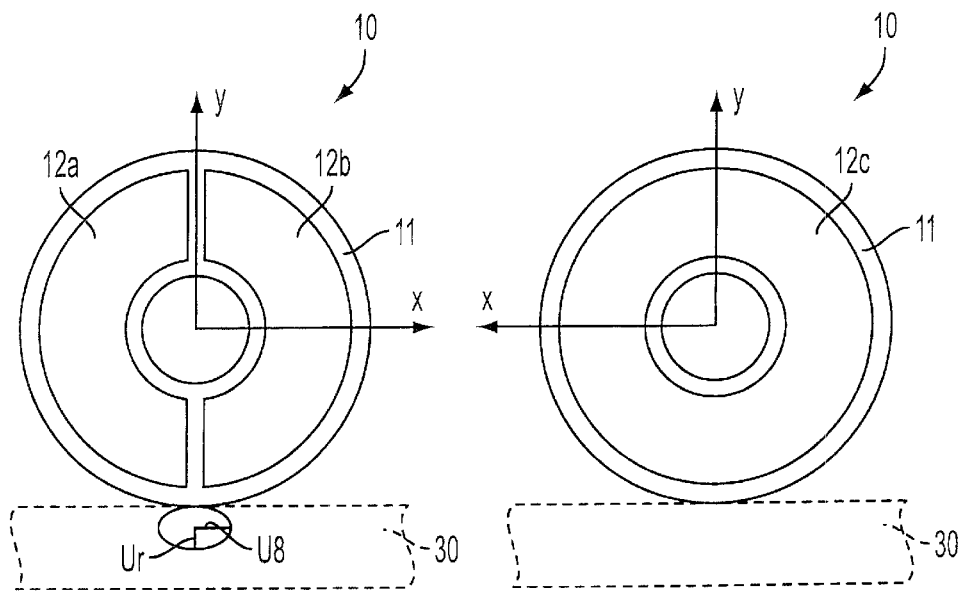
FIG. 21A
(PRIOR ART)
FIG. 21B
(PRIOR ART)
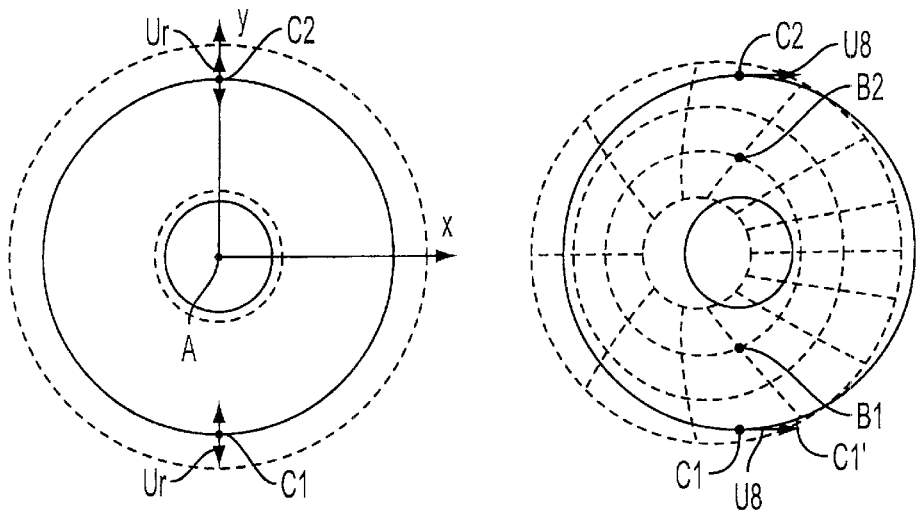
FIG. 21C
(PRIOR ART)
FIG. 21D
(PRIOR ART)

VIBRATION ACTUATOR WITH TWO VIBRATION MODES

INCORPORATION BY REFERENCE

The disclosures of the following priority applications are incorporated herein by reference:
- Japanese Patent Application No. 11-257872 filed Sep. 10, 1999.
- Japanese Patent Application No. 11-259708 filed Sep. 14, 1999.
- Japanese Patent Application No. 11-339514 filed Nov. 30, 1999.
- Japanese Patent Application No. 2000-106960 filed Apr. 7, 2000.
- Japanese Patent Application No. 2000-120296 filed Apr. 21, 2000.

BACKGROUND OF THE INVENTION

1. Field of the Invention

The present invention relates to a vibration actuator which employs both a symmetric expansion vibration mode in the radial direction and also a vibration mode in a non-axisymmetric plane.

2. Description of the Related Art

Vibration actuators which employ both a radial symmetric expansion vibration mode and also a non-axisymmetric planar vibration mode are known. Such a vibration actuator utilizes a vibration element which simultaneously generates a radial symmetric expansion vibration mode in which it expands and contracts from the center in the direction towards the circumference (expanding and contracting in the radial direction), and also a non-axisymmetric planar vibration mode in which it is deformed in a non-axisymmetric manner within its plane. This vibration element is shaped as a circular plate having a central hole. Such vibration actuators are disclosed in Japanese Patent Publication No. 6-26994 etc., and they are well adapted to thin construction and are distinguished by high speed and high propulsive force and the like.

FIGS. 21A through 21D are figures for explanation of a prior art vibration element of a vibration actuator which employs both a radial symmetric expansion vibration mode and also a non-axisymmetric planar vibration mode.

A vibration element 10 comprises a piezoelectric element 11 and an electrode 12, etc. The piezoelectric element 11 may, for example, be formed from a piezoelectric material such as PZT or the like in the shape of a plate doughnut, and its entire surface is polarized in the thickness direction. This plate doughnut shape is formed so that its resonant frequencies in the radial symmetric expansion vibration mode (R,1) and also in the non axially symmetric planar vibration mode ((1,1)) are almost equal.

As shown in FIG. 21A, first and second fan shaped electrodes 12a and 12b are formed upon the front surface of the piezoelectric element 11. As shown in FIG. 21B, a third electrode 12c is formed over almost the entire rear surface of the piezoelectric element 11.

A first AC voltage is applied to the first electrode 12a by a drive voltage generation apparatus (not shown in the figures) which comprises an oscillator, a phase shifter, an amplifier and the like. Further, a second AC voltage which differs in electrical phase from the first AC voltage by 90° is applied by the drive voltage generation apparatus to the second electrode 12b. The third electrode 12c upon the rear surface is connected to earth so as to be at electric ground potential.

The vibration element 10 resonates so as to vibrate in both the two above described modes by the frequency of the AC voltage which is applied being brought close to the resonant frequencies of these two modes, and thereby a radial symmetric expansion vibration and also a non-axisymmetric vibration are simultaneously generated.

As shown in FIG. 21C, the radial symmetric expansion vibration mode (R,1) is a vibration mode in which the vibration element 10 extends and withdraws in the radial direction with respect to the vibration center point A, which is at nearly the same position as the central position of the outer circumferential shape of the vibration element 10. The displacement component Ur in the radial direction is generated at the points C1 and C2 which are positioned on the circumference of the vibration element 10.

Further, as shown in FIG. 21D, the non axially symmetric planar vibration mode ((1,1)) is a vibration mode in which the vibration element 10 is repeatedly deformed leftwards and rightwards in a single plane, as shown by the dashed lines, with the points B1 and B2 being nodes, so that displacement components Uθ in the directions of the arrows are generated at the points C1 and C2.

And an elliptic motion like that shown in FIG. 21A is generated as the combined displacement due to both these two vibrations in the vibration element 10 at the positions of the points C1 and C2, which are the drive force take-out portions of the vibration element 10. When the vibration element 10 is pressed into contact with a relative movement member 30 at the positions of these points C1 and C2, a frictional force is generated in the direction of displacement of the relative movement member 30, and thereby it is possible to supply direct drive force to the relative movement member 30.

Since a prior art vibration actuator takes advantage of vibration modes like those described above, it is thereby possible to realize a thin drive apparatus of small size, because according to theory the vibrational displacement only takes place in one plane.

However, when it is contemplated to apply this vibration actuator to a small sized portable electronic device which is powered by a battery, or the like, the requirement arises for the drive voltage to be reduced as much as possible. In particular, with current portable electronic devices, along with reduction of battery size, there is a tendency to reduce the voltage of the power source for the incorporated circuitry, and these requirements become more and more demanding.

SUMMARY OF THE INVENTION

A primary objective of the present invention is to provide a vibration actuator of sufficient rigidity which can drive with good efficiency relative to the drive voltage, and which moreover can drive at high torque with low drive voltage; and with which at the same time, further, the reduction of size can be anticipated with a simple and also cheap structure.

Another objective of the present invention is to provide a vibration actuator which can support its vibration element so as not to damp the vibration energy which this vibration element imparts to its relative movement member.

The vibration actuator according to the present invention includes a vibration actuator including a vibration element, which simultaneously generates a radial symmetric expansion vibration mode in which the vibration element expands and contracts in the radial direction and a non-axisymmetric planar vibration mode in which the vibration element bends to and fro in a non-axisymmetric manner within the same plane on which the radial symmetric expansion vibration is generated, and thereby drives a relative movement member. And this vibration element comprises at least one superimposed layer structure comprising an elastic member sandwiched between a pair of electrical energy to mechanical energy conversion elements.

The electrical energy to mechanical energy conversion elements and the elastic member included in this vibration actuator may be shaped as circular plates with central holes, and the elastic member is provided with a support member which supports the vibration element at at least one portion of the outer or inner circumference of the elastic member.

The electrical energy to mechanical energy conversion elements and the elastic member included in this vibration actuator may be shaped as circular plates, and the vibration actuator may further comprises a drive force take out portion, formed so as to project outwards from the outer circumference of the elastic member, and which transmits drive force obtained from vibration which is generated in the vibration element to the relative movement member.

It is desirable for the thickness of the elastic member to be equal to or greater than the thickness of the electrical energy to mechanical energy conversion elements.

Each of the pair of electrical energy to mechanical energy conversion elements may include a plurality of electrodes which are symmetrically arranged relative to the elastic member, and to each of which an AC voltage is input, with the AC voltages for the two electrical energy to mechanical energy conversion elements differing in phase. And, among this plurality of electrodes of this pair of electrical energy to mechanical energy conversion elements, those electrodes which are symmetrically arranged relative to the elastic member may be respectively supplied with AC voltages in the same phase.

The electrical energy to mechanical energy conversion elements and the elastic member comprised of the vibration element may be shaped as circular plates with central holes, and the vibration element is provided with a pressure member which presses the vibration element against the relative movement member upon the outer circumference of the vibration element or upon the inner circumference of the central hole in the vibration element.

It is desirable for the pressure member to be formed as the same member as the elastic member, and for the pressure member to support the vibration element. In this case, the pressure member may include a projecting portion which projects from the elastic member, with the vibration element being pressed against the relative movement member by the elasticity of the projecting portion.

In the vibration actuator described above, the thicknesses of the pair of electrical energy to mechanical energy conversion elements may desirably be equal. It is desirable for the thickness of the electrical energy to mechanical energy conversion elements to be equal to or less than the thickness of the elastic member. In more detail, it is desirable for the thickness of the electrical energy to mechanical energy conversion elements to be between $1/3$ and $1/20$ of the overall thickness of the vibration element. Yet further, it is desirable for the structure of the vibration element including its thickness and its electrode arrangement to be upwards and downwards symmetric about the center of its thickness.

Another vibration actuator according to the present invention includes a vibration element, which simultaneously generates a radial symmetric expansion vibration mode in which the vibration element expands and contracts in the radial direction and a non-axisymmetric planar vibration mode in which the vibration element bends to and fro in a non-axisymmetric manner within the same plane on which the radial symmetric expansion vibration is generated, and thereby drives a relative movement member; and a support unit including a plurality of structural elements, which supports the vibration element. The plurality of structural elements of the support unit are arranged in superimposed layers with respect to the vibration element in the direction perpendicular to the vibration plane of the non axially symmetric planar vibration mode.

The plurality of structural elements may include: a support member which supports the vibration element; an urging member which urges the vibration element via the support member; and a guide member which guides the support member in a direction parallel to the vibration direction in the radial symmetric expansion vibration mode and only allows displacement in this predetermined direction. The support member and the urging member may be provided in a space formed by projecting the vibration surface of the vibration element to the side of the support unit. The urging member may be provided along a plane which extends in the predetermined direction of the support member. It is desirable for a plurality of the urging members to be provided, mutually opposing one another and extending along the predetermined direction of the support member.

Yet another vibration actuator according to the present invention includes: a vibration element formed as a circular plate with a central hole; a base member to which the vibration element is fixed; and a support member which supports the vibration element by the central hole thereof in order to fix the support member to the base member. One side of the support member is fixed to the base member, and the other side of the support member is fixed to the vibration element; and elastic portion is provided between a portion to which said base member is fixed and a portion to which said vibration element is fixed.

The elastic portion may be formed so that the resonance frequency ωn determined by the mass of the vibration element and the rigidity of the elastic member is less than the frequency ω at which the vibration element is excited. The elastic portion of the support member may be constricted or hollow. At least the elastic portion of the support member may be made of metal. The vibration element may include an elastic member having a central hole, and a pair of electrical energy to mechanical energy conversion elements having central holes, provided upon both sides of the elastic member, and each of the pair of electrical energy to mechanical energy conversion element comprises an electrode separated into two portions along its radial direction. The support member and the elastic member may desirably be formed integrally as the same member.

Yet another vibration actuator according to the present invention includes a vibration element, which simultaneously generates a radial symmetric expansion vibration mode in which the vibration element expands and contracts in the radial direction and anon-axisymmetric planar vibration mode in which the vibration element bends to and fro in a non-axisymmetric manner within the same plane, on which the radial symmetric expansion vibration is generated, and thereby drives a relative movement member, and a base member to which the vibration element is fixed; with the vibration element including at least one superimposed layer structure including a pair of electrical energy to mechanical energy conversion elements and an elastic member sandwiched between the pair of electrical energy to mechanical energy conversion elements; and with the elastic member including a ring shaped portion to both the sides of which the pair of electrical energy to mechanical energy conversion elements are stuck, and a cylindrical shaped support portion, formed integrally with the ring shaped portion, which fixes the vibration element to the base member; and the support portion including an elastic portion which suppresses the transmission of vibration generated in the vibration element to the base member.

BRIEF DESCRIPTION OF THE DRAWINGS

FIG. 15A is a plan view showing an apparatus for supporting a vibration element of a vibration actuator in an eighth embodiment.

FIG. 15B is a side view of the support apparatus in FIG. 15A.

FIG. 15C is a front view of the support apparatus in FIG. 15A.

FIGS. 21A through 21D are figures for explanation of a vibration actuator which employs both a radial symmetric expansion vibration mode and also a non-axisymmetric planar vibration mode.

DESCRIPTION OF THE PREFERRED EMBODIMENTS

Embodiments of the present invention will now be explained in detail with reference to the figures.

First Embodiment

Figure 1A:
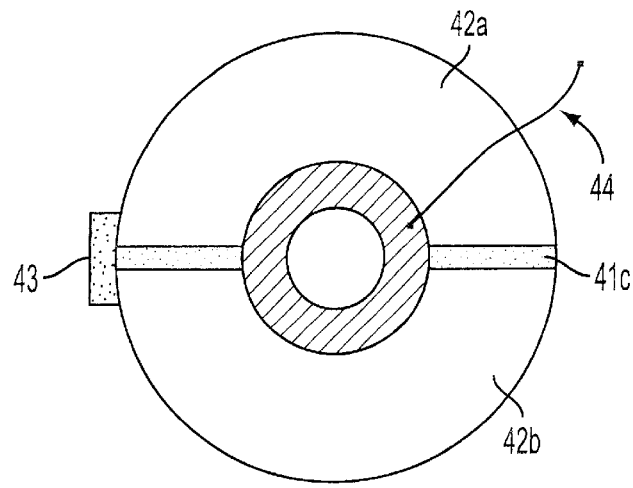
FIG. 1A is a plan view showing a vibration element of a first embodiment of the vibration actuator according to the present invention as seen from the front surface thereof.
Figure 1B:
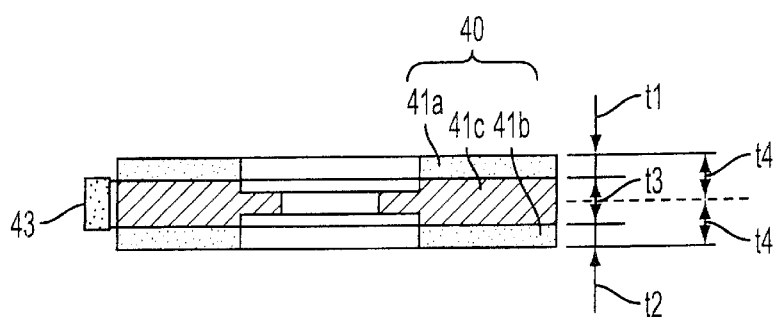
FIG. 1B is a vertical sectional view of the vibration element shown in FIG. 1A.
Figure 1C:
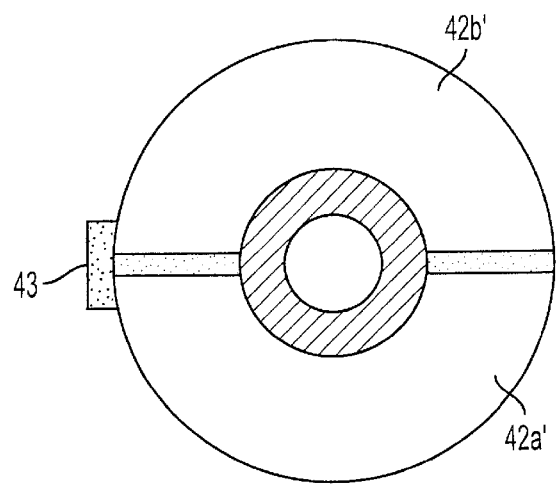
FIG. 1C is a plan view showing the vibration element in FIG. 1A as seen from the rear.

FIGS. 1A through 1C are figures showing a vibration element in a first preferred embodiment of the vibration actuator according to the present invention. FIG. 1A is a view showing the vibration element as seen from the front surface thereof, FIG. 1B is a sectional view of this vibration element, and FIG. 1C is a view showing this vibration element as seen from the rear surface thereof.

With this vibration actuator according to the first embodiment, the vibration element 40 comprises a pair of ceramic piezoelectric elements 41a and 41b with the same thickness t1 and t2 which are electrical energy to mechanical energy conversion elements, and a metallic plate 41c with thickness t3 provided between the ceramic piezoelectric elements 41a and 41b which is an elastic member which has high sharpness of resonance. The ceramic piezoelectric elements 41a and 41b and the metallic plate 41c are stuck together with electrically conducting adhesive or the like. The ceramic piezoelectric elements 41a and 41b and the metallic plate 41c are formed as circular plates having central holes, and their dimensions are determined so that their (R,1) and ((1,1)) vibration modes have almost equal resonant frequencies.

Electrodes (not shown in the figures) are provided upon the entire inner surfaces of the two ceramic piezoelectric elements 41a and 41b which face towards the metallic plate 41c. Upon their opposite surfaces, i.e. upon the front and the rear surfaces of the vibration element, there are respectively provided electrodes 42a and 42b and 42a' and 42b', each of which is separated into two portions on each of these surfaces. The ceramic piezoelectric elements 41a and 41b are stuck to the metallic plate 41c so that their respective electrode portions 42a and 42a', and 42b and 42b', are symmetrically positioned and have a form with respect to the metallic plate 41c. In other words, the electrode 42a and 42b and the electrode 42a' and 42b' are of identical shape and are positioned upon opposite sides with respect to the metallic plate 41c.

It is desirable for the thickness t3 of the metallic plate 41c to be equal to or greater than the thickness t1 (=t2) of the ceramic piezoelectric elements 41a and 41b, in order to impart sufficient strength to the vibration element 40. In this first embodiment, t3 is greater than t1.

Further, a sliding member 43 is stuck to a portion of the side surface of the central metallic plate 41c adjacent to the boundary portions of the electrodes 42a and 42b. This sliding member 43 may be made from a resin or the like which has good anti wear characteristics. The reference numeral 44 denotes a ground lead.

With this embodiment, as explained above, the respective thicknesses t1 and t2 of the two ceramic piezoelectric elements 41a and 41b are equal. Accordingly it is possible to suppress the generation of bending vibrations outside the planes of the ceramic piezoelectric elements 41a and 41b when they vibrate in the above described vibration modes, since it is possible to ensure that the mechanical properties (Young's modulus, density, etc.) of the front and rear surfaces of the vibration element 40 are equal. Furthermore, the mechanical symmetry of the vibration element 40 is preserved by ensuring its symmetric form in the thickness direction, i.e. by ensuring that the thickness t4 of the vibration element 40 from the central plane of the metallic plate 41c are equal to each other at the front and rear surface sides of the vibration element 40. This construction also is effective for preventing bending vibration and the like of the vibration element 40 outside its plane.

Moreover, it is desirable for the both thickness t1 and t2 of the ceramic piezoelectric elements 41a and 41b to be from about $\frac{1}{3}$ to about $\frac{1}{20}$ of the entire thickness of the vibration element. The theory which justifies this is as follows.

When the thickness of the ceramic piezoelectric elements 41a and 41b which are the source for generation of vibration is small with respect to the entire thickness of the vibration element, it becomes difficult to generate vibration, and the performance (drive force and speed) of the vibration actuator is deteriorated.

Figure 2A:
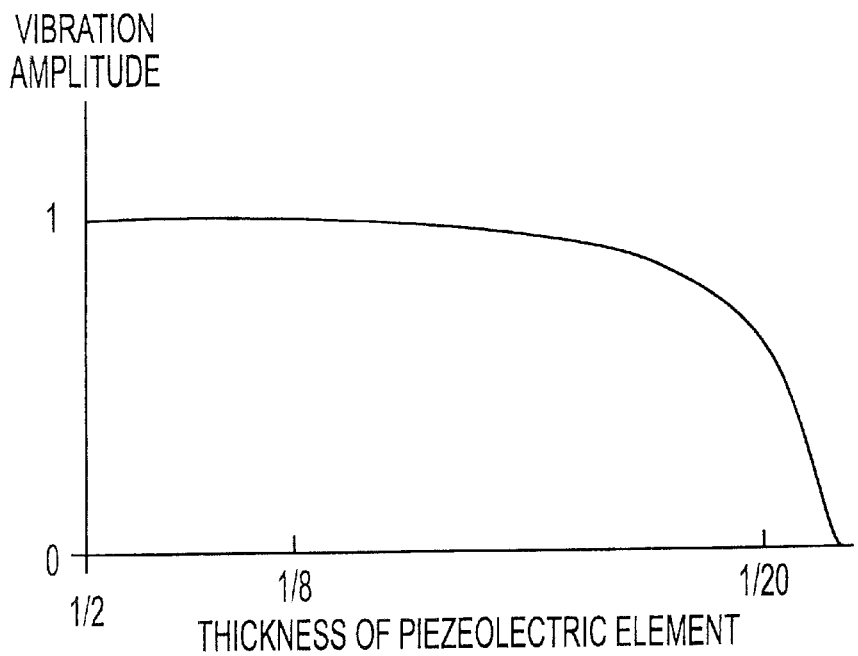
FIG. 2A is a graph showing the relationship between the thickness ratio of a ceramic piezoelectric element (the thickness of one of its layers/its entire thickness) and vibration amplitude.

FIG. 2A is a graph showing the relationship, obtained as a result of experiment, between the thickness ratio of a ceramic piezoelectric element (the thickness of one of its layers/its entire thickness) and the amplitude of the vibrations. The origin for the horizontal axis in FIG. 2A is at ½. At this origin position the thickness of the metallic plate 41c is zero, and the thickness of each of the ceramic piezoelectric elements 41a and 41b is ½ of the entire thickness of the vibration element. The amplitude of the vibration is shown along the vertical axis. Since this vibration amplitude is at its greatest when no elastic member is present, its greatest value is normalized to unity at this point. From FIG. 2A it will be understood that an acceptable vibration magnitude can be obtained provided that the thickness of each one of the ceramic piezoelectric elements 41a and 41b is equal to or greater than $\frac{1}{20}$ of the entire thickness of the vibration element.

Now, since the electrical energy to mechanical energy conversion elements 41a and 41b are made of ceramic such as PZT or the like, it is inevitable that their physical parameters such as density will vary widely. In other words, individual differences between various ones of the ceramic piezoelectric elements 41a and 41b are inevitable. Accordingly, when the thickness ratio of the ceramic piezoelectric elements 41a and 41b becomes great, deviation of the resonance frequency (individual differences between various manufactured examples) also becomes great.

Figure 2B:
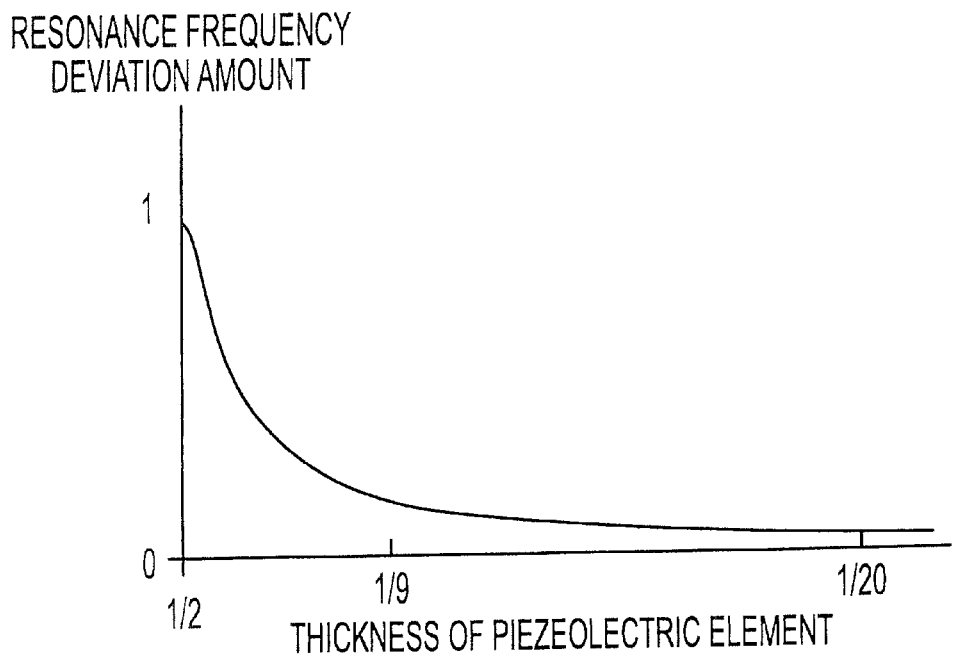
FIG. 2B is a graph showing the relationship between the thickness ratio of a ceramic piezoelectric element (the thickness of one of its layers/its entire thickness) and resonance frequency deviation amount.

FIG. 2B is a graph showing the relationship, obtained as a result of experiment, between the thickness ratio of a ceramic piezoelectric element (the thickness of one of its layers/its entire thickness) and the resonance frequency deviation amount. The magnitude of the deviation of the resonance frequency is shown along the vertical axis in this figure. Since in the condition where the thickness of the elastic member is zero the resonance frequency deviation amount is at its greatest, its greatest value is normalized to unity. From FIG. 2B it will be understood that it is possible to restrict the amount of resonance frequency deviation within an acceptable level, provided that the thickness of each one of the ceramic piezoelectric elements 41a and 41b is equal to or less than $\frac{1}{3}$ of the entire thickness of the vibration element.

Figure 3:
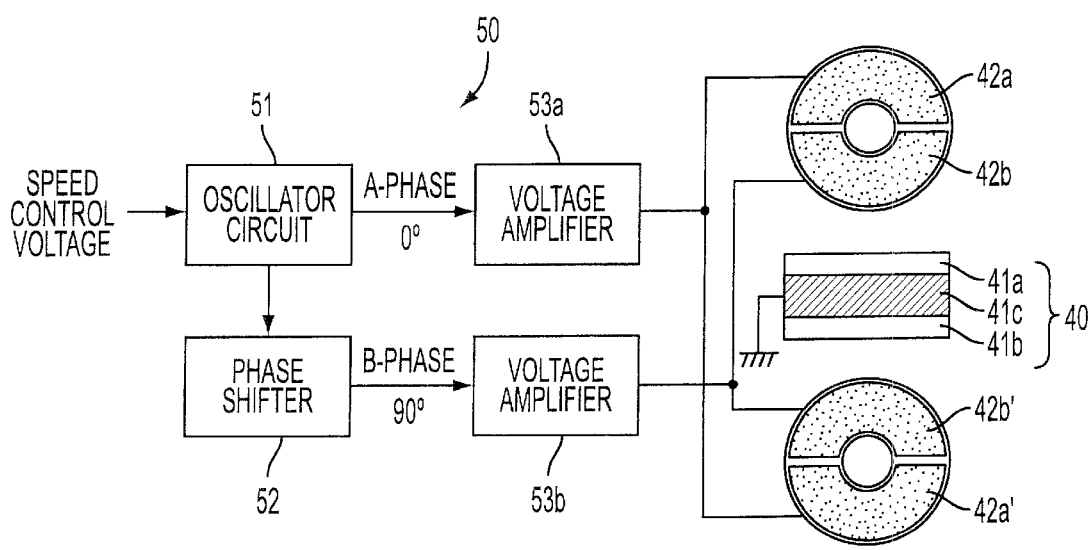
FIG. 3 is a block diagram showing a drive circuit for the vibration actuator in the first embodiment.

FIG. 3 is a block diagram showing a drive circuit for the vibration actuator shown in FIG. 1.

In this drive circuit 50, an oscillator circuit section 51 is a circuit section which outputs a drive frequency for the vibration actuator. This oscillator circuit section 51 is a voltage-controlled oscillator (VCO) with which the drive frequency is changed according to a speed control voltage supplied from a control circuit section not shown in the figures.

A phase shifter 52 is a circuit which inputs the signal from the oscillator circuit section 51 and which produces a drive signal which differs in phase by 90° with respect to the signal output from the oscillator circuit section 51. Voltage amplification sections 53a and 53b respectively input the output (whose phase is termed "A-phase") from the oscillator circuit section 51 and the output (whose phase is termed "B-phase") from the phase shifter 52 to produce the appropriate voltages required for drive. And the outputs from the voltage amplification sections 53a and 53b are respectively supplied to the electrodes 42a, 42b of the ceramic piezoelectric element 41a and to the electrodes 42a', 42b' of the ceramic piezoelectric element 41b.

Thus, when driving the vibration element 40, periodic signals in the same phase (both in A-phase) are input to the front electrode 42a and the rear electrode 42a'. And periodic signals (both in B-phase) of the same voltage as these A-phase periodic signals but differing in phase by 90° therefrom are input to the front electrode 42b and the rear electrode 42b'.

In other words, in each of the pair of electrical energy to mechanical energy conversion elements 41a and 41b, the respective plurality of electrodes 42a and 42b and electrodes 42a' and 42b', into which the respective AC voltages in the differing A-phase and B-phase are input, are provided symmetrically with respect to the metallic plate 41c. Among the plurality of electrodes 42a and 42b and electrodes 42a' and 42b' of the pair of electrical energy to mechanical energy conversion elements 41a and 41b, signals in the same phase are input to the electrodes 42a and 42a' which are disposed symmetrically with respect to the metallic plate 41c, and to the electrodes 42b and 42b' which are likewise disposed symmetrically with respect to the metallic plate 41c.

In this manner the vibration element 40 is excited, and vibrations in the radial symmetric expansion vibration mode (R,1) and the non axially symmetric planar vibration mode ((1,1)) are generated. Accordingly elliptic motion is generated at the portion at which the sliding member 43 is provided, so that it is possible to cause relative displacement between the vibration element and a relative movement member which is not shown in the figures by pressing this relative movement member into contact with the vibration element. This movement is identical to that explained with reference to FIGS. 21A through 21D.

Since as described above the metallic plate 41c is sandwiched between and supported by the two ceramic piezoelectric elements 41a and 41b which are stuck to its front and rear surfaces, the front and rear surfaces of the vibration element 40 are of symmetric construction. Accordingly, it is possible to suppress the generation of extra-planar bending vibrations occurring on a plane except for a relevant plane which are not necessary for drive purposes. Moreover, it is possible to drive the vibration actuator efficiently.

If a ceramic piezoelectric element were only to be stuck to the metallic plate upon one surface thereof, then the ceramic piezoelectric element would only be deformed upon one side. If the thickness of the ceramic piezoelectric elements on each of the front and the rear surfaces were different, then the front and rear amounts of deformation would be different. As a result, the balance of forces on the front and the rear surfaces of the vibration element would be upset, and an extra-planar bending vibration such as warp would be set up in the metallic plate. Due to this it would become impossible to obtain the desired drive force; however, with the present invention, it is possible to prevent this type of problem.

By adopting this kind of three layered structure in which the metallic plate 41c is sandwiched between and supported by the two ceramic piezoelectric elements 41a and 41b, the vibration element 40 as a whole can be sufficient rigid, even if the ceramic piezoelectric elements 41a and 41b are quite thin.

If the size of the vibration actuator is to be reduced, as the vibration element 40 is made smaller and smaller, the strength of the vibration element 40 often comes to be a problem. In this case it is possible to ensure that the vibration actuator cannot easily be damaged while maintaining sufficient strength thereof, since it is constructed so that the thickness of the metallic plate 41c which is sandwiched between the two ceramic piezoelectric elements 41a and 41b is equal to or greater than the thickness of the ceramic piezoelectric elements 41a and 41b.

Since it is arranged that the thickness of a single one of the ceramic piezoelectric elements 41a and 41b is from 1/3 to 1/20 of the entire thickness of the vibration element, therefore, along with it being possible to guarantee sufficient performance (drive force and speed), the deviation of the resonance frequency (individual differences between various manufactured examples) is also small, so that stable drive becomes possible.

Further, it is possible to increase the voltage applied per unit thickness by reducing the thickness of the ceramic piezoelectric elements 41a and 41b, so that it is possible to reduce drive voltage. Moreover, AC voltage in the same phase (the A-phase) is applied to the electrode 42a of the ceramic piezoelectric element 41a and to the electrode 42a' of the ceramic piezoelectric element 41b which are in a mutually symmetric positional relationship with respect to the metallic plate 41c, while in the same manner AC voltage in the same phase (the B-phase) is applied to the electrode 42b of the ceramic piezoelectric element 41a and to the electrode 42b' of the ceramic piezoelectric element 41b which are similarly in a mutually symmetric positional relationship with respect to the metallic plate 41c. As a result, the outputs of the ceramic piezoelectric elements 41a and 41b come to be added together, and a high torque drive force is obtained. Furthermore, it is possible to prevent a bimorph effect.

Yet further, since it is arranged that the thicknesses of both the ceramic piezoelectric elements 41a and 41b are equal, and also the voltage levels of the drive signals which are input to them are made equal, thereby it is ensured that the vibration element does not vibrate in the direction perpendicular to its plane of vibration, and high efficiency drive becomes possible. If the thicknesses of the ceramic piezoelectric elements are different, then it is necessary to adjust the voltage levels of their input drive signals so as to make the vibration conditions for their front and rear surfaces the same.

Second Embodiment

A second preferred embodiment of the vibration actuator according to the present invention will now be explained.

Figure 4A:
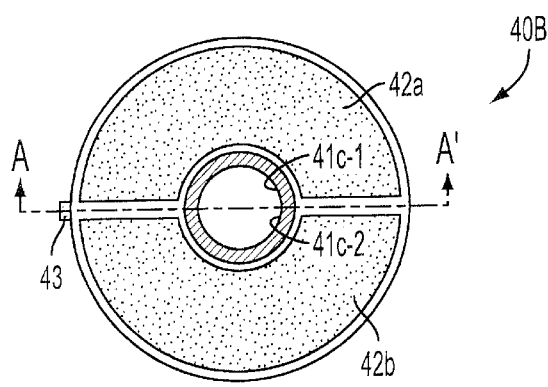
FIG. 4A is a plan view showing a vibration element in a second embodiment of the vibration actuator according to the present invention as seen from the front surface thereof.
Figure 4B:
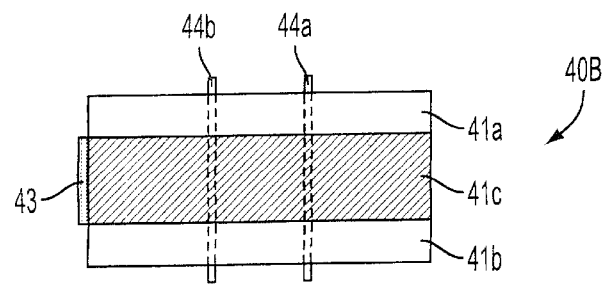
FIG. 4B is a side view of the vibration element in FIG. 4A.
Figure 4C:
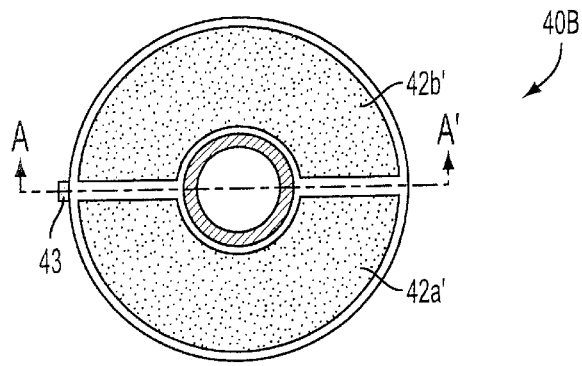
FIG. 4C is a plan view showing the vibration element in FIG. 4A as seen from the rear surface thereof.
Figure 4D:
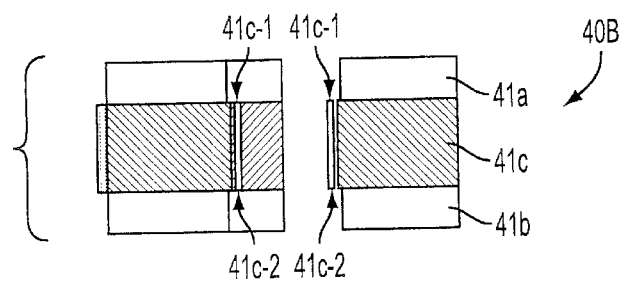
FIG. 4D is a sectional view of the vibration element of FIG. 4A taken along the line A–A'.
Figure 5A:
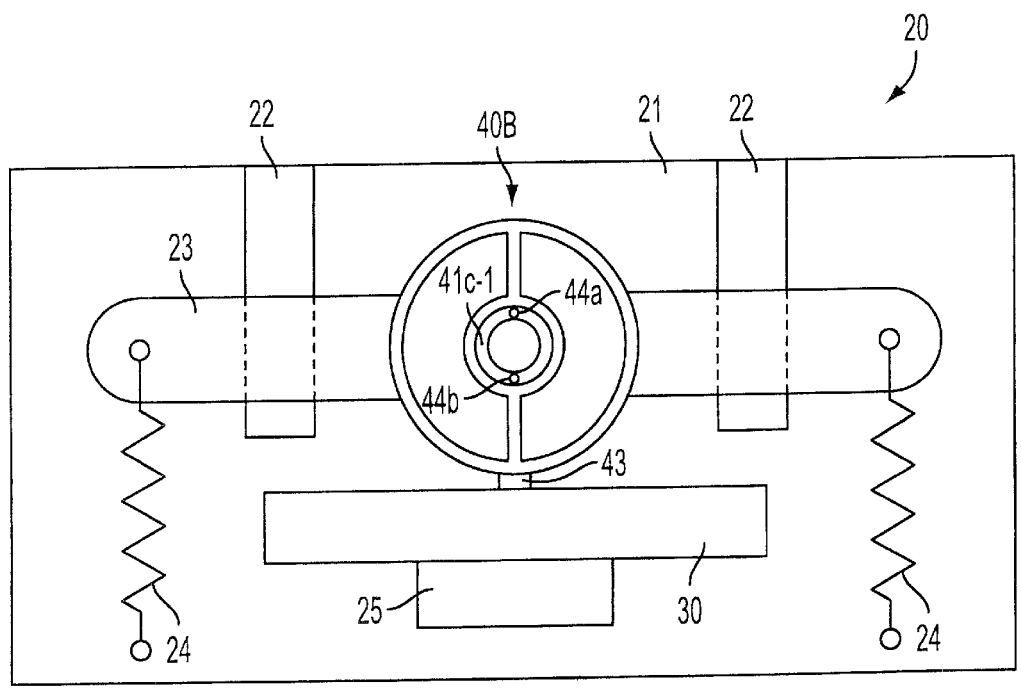
FIG. 5A is an elevation view showing the vibration actuator according to the second embodiment.
Figure 5B:
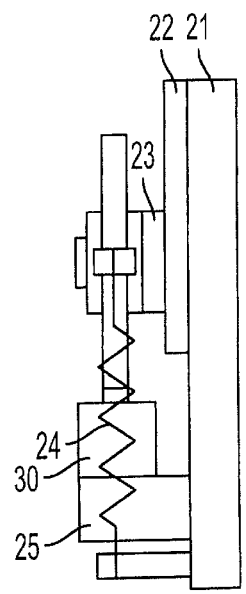
FIG. 5B is a side view of the drive apparatus in FIG. 5A.

FIGS. 4A through 4D are figures showing a vibration element of the vibration actuator according to the second embodiment of the present invention, while FIGS. 5A through 5B are overall views of this vibration actuator according to the second embodiment. FIG. 4A is a plan view of this vibration element 40B; FIG. 4B is a side view showing being provided with support posts 44a and 44b the vibration element 40B; and FIG. 4C is a bottom view showing this vibration element. Moreover, FIG. 4D is a sectional view of the vibration element 40B taken along the dashed line A–A' shown in FIGS. 4A and 4C, and in the right half of this figure the ceramic piezoelectric elements 41a and 41b and the metallic plate 41c, which would be seen as a backing to the central empty hole portion, are omitted. It is to be noted that, in this and in all the subsequent embodiments which will be discussed herein, the same reference symbols as used in the explanation in the first preferred embodiment will be used for parts which have the same function as in that first embodiment, and repetitive figures and explanation will be appropriately omitted.

It is to be noted that, with this vibration element 40B in the second preferred embodiment, the use of the metallic plate 41c which is sandwiched between the ceramic piezoelectric elements 41a and 41b for the fixed support is shown and described by way of example.

This metallic plate 41c is formed as a circular plate with a central hole, the inner wall of which projects inwards from the ceramic piezoelectric elements 41a and 41b. This portion will be termed the ring shaped projecting portion 41c-1. Holes 41c-2 for fixed supports are pierced through this ring shaped projecting portion 41c-1. If the vibration element 40B is to be fixedly supported, the support posts 44a and 44b are inserted into these holes 41c-2 and fixed to a support frame 23 which will be described hereinafter. It is to be noted that, in order not to hamper the non axially symmetric planar vibration mode, it is desirable to provide these holes 41c-2 at or near the vibrational nodes of this non axially symmetric planar vibration mode, in other words in the vicinity of the points B1 and B2 shown in FIG. 21D.

It is to be noted that, even when a metallic plate 41c which is thicker than the ceramic piezoelectric elements 41a and 41b is used, by appropriately selecting the outer and inner diameters of the ceramic piezoelectric elements 41a and 41b, the proper vibration modes are not lost, and vibrations can be effectively excited.

In this manner, with the vibration actuator according to this second preferred embodiment, in addition to the beneficial effects which were attained with the first embodiment, since the ring shaped projecting portion 41c-1 and the holes 41c-2 are provided in the central hole portion of the metallic plate 41c with rigidity and are used for fixed support portions, thereby the outer diameter does not become too large, and this vibration element 40B can be simply and moreover securely fixed.

Next, the overall structure of a drive apparatus 20 to which this vibration element 40B is fitted will be described with reference to FIGS. 5A and 5B. FIG. 5A is an elevation view of the drive apparatus 20, while FIG. 5B is a side view thereof. This drive apparatus 20 comprises a base member 21, guide members 22, 22 which are disposed upon the base member 21, a support frame 23 which is supported by the guide members 22, 22 so as to be movable and to which the vibration element 40B of the vibration actuator is fixedly attached, pressing springs 24, 24 which urge the support frame 23 toward a relative movement member 30, and a running guide member 25 which guides the relative moving member 30 so that it can run (sideways in FIG. 5A) while contacting the sliding member 43 of the vibration element 40B.

As previously described, the vibration element 40B is fixed to and is supported by the support frame 23 via the support posts 44a and 44b. Since the support frame 23 which supports the vibration element 40B is supported so as to be able to move while being guided by the two guide members 22 which are provided in a direction substantially perpendicular to the direction of displacement of the relative moving member 30, therefore the vibration element 40B can approach the relative moving member 30 substantially perpendicularly. And, since the two pressing springs 24 are provided at both ends of the support frame 23, the vibration element 40B can be pressed into close contact against the relative moving member 30 by these pressing is springs 24.

By inputting the desired drive signals to each of the electrodes provided to the vibration element 40B while the vibration element 40B is pressed in this manner into close contact against the relative moving member 30, it becomes possible to drive the relative moving member 30.

Figure 6:
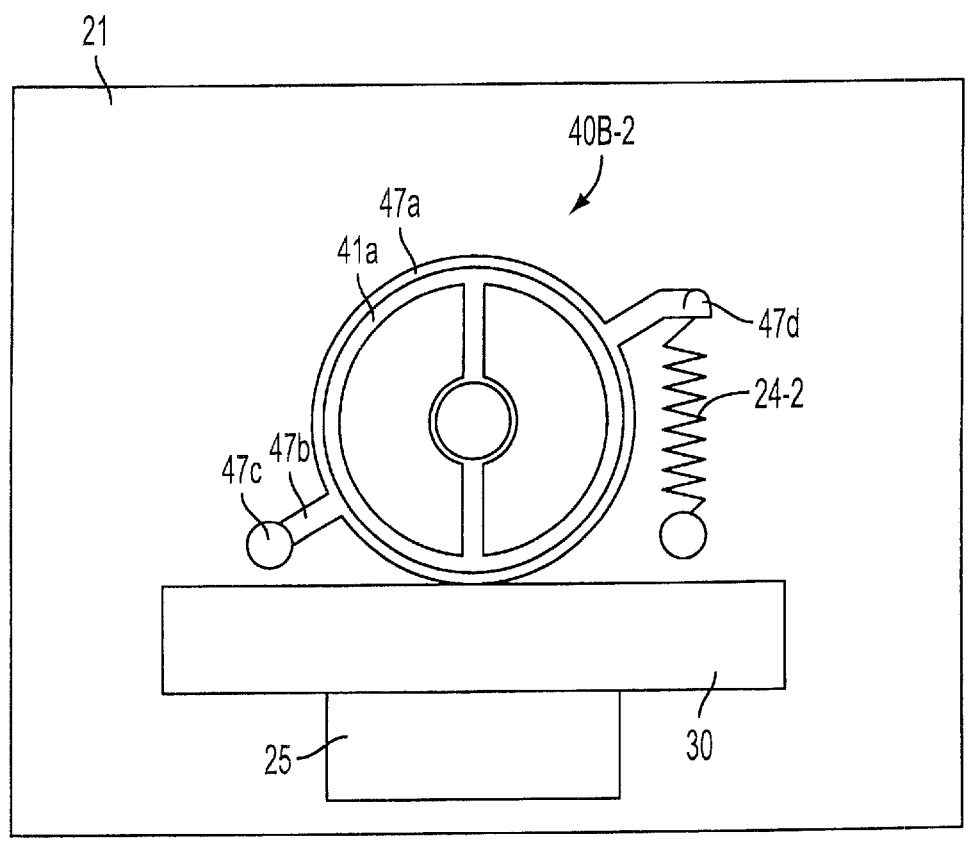
FIG. 6 is a plan view showing a vibration actuator which is a variant of the second embodiment.

Next a variant of the above second embodiment will be described with reference to FIG. 6. The vibration element 40B-2 according to this variant second embodiment includes a metallic plate 47 which is sandwiched between two ceramic piezoelectric elements 41a and 41b, and is supported upon a base 21 via an integral support arm portion 47b which projects from this metallic plate 47, with biasing force being input to the metallic plate 47 via an integral spring attachment arm portion 47d.

The diameter of this metallic plate 47 is greater than the diameter of the ceramic piezoelectric elements 41a and 41b. The support arm portion 47b and the spring attachment arm portion 47d project from the circumferential edge portion 47a of the metallic plate 47 at mutually opposite sides thereof.

A fixed pin shaped element 47c is provided at the end of the support arm portion 47b, and the metallic plate 47 is rotatably mounted to the base member 21 via this fixed pin shaped element 47c. One end of a pressing spring 24-2 is attached to the spring attachment arm portion 47d, so that the metallic plate 47, i.e. the vibration element 40B-2, is biased in the clockwise rotational direction around the fixed pin shaped element 47c by the biasing force of this spring 24-2. Since the relative moving member 30 is arranged within the range of rotational movement of the vibration element 40B-2, the circumferential edge portion 47a, i.e. the vibration element 40B-2, is pressed into contact with the relative moving member 30 by the biasing force of the spring 24-2. Accordingly, in this variant of the second embodiment, the circumferential edge portion 47a functions as a slide member.

Since in this manner the vibration element 40B-2 is supported with the integral support arm portion 47b projecting from the metallic plate 47, and also the metallic plate 47 with its integral spring attachment arm portion 47d are used as a biasing mechanism, thereby it is possible to make the structure of the vibration actuator simple.

Third Embodiment

Figure 7A:
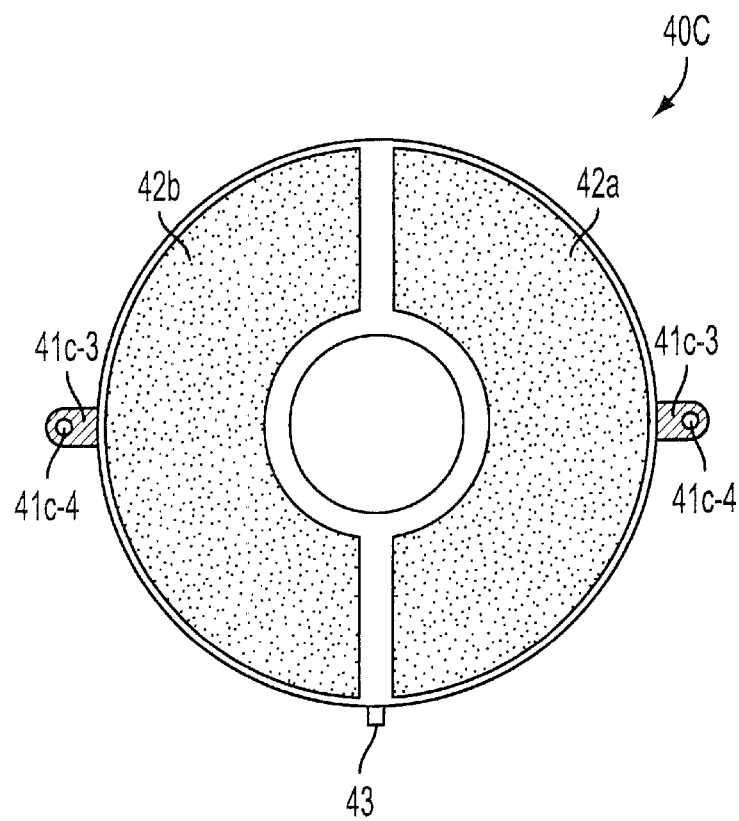
FIG. 7A is a plan view showing a vibration element in a third embodiment of the vibration actuator according to the present invention as seen from the front surface thereof.
Figure 7B:
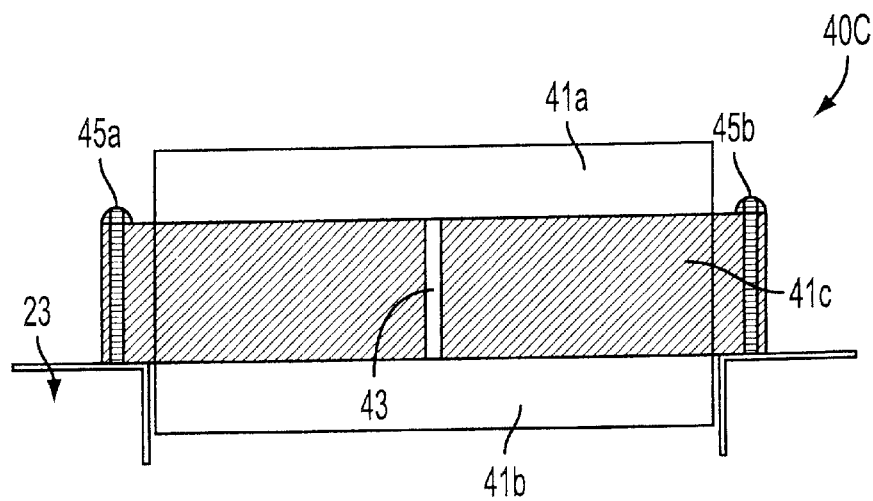
FIG. 7B is a side view showing the vibration element in FIG. 7A a portion of which is hatched.

FIGS. 7A and 7B show a vibration element of the vibration actuator according to a third embodiment of the present invention. FIG. 7A is a plan view of this vibration element 40C, while FIG. 7B is a side view thereof.

The vibration element 40C in this third preferred embodiment is provided with the fixed support structure different from that in the second embodiment in which a pair of mounting projections 41c-3 are formed at opposite sides of the outer circumference of the metallic plate 41c, and a pair of fixed support holes 41c-4 are pierced through these mounting projections 41c-3. Mounting screws 45a and 45b are passed through these holes 41c-4 and are screwed into the support frame 23, so that the vibration element 40C is thereby fixed.

In this manner, in this third embodiment, the mounting projections 41c-3 and the support holes 41c-4 are provided as supporting portions on the outer periphery of the metallic plate 41c. Accordingly, the manufacturing and fixing work for the metallic plate 41c is simple. Furthermore, There is little influence upon the vibration mode which generates the drive force (the planar non axially symmetric vibration mode).

Fourth Embodiment

Figure 8A:
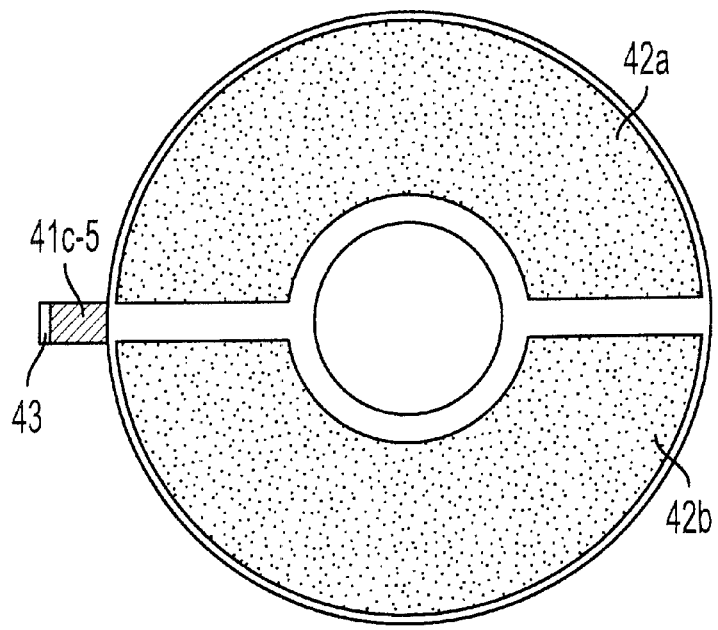
FIG. 8A is a plan view showing a vibration element in a fourth embodiment of the vibration actuator according to the present invention as seen from the front surface thereof.
Figure 8B:
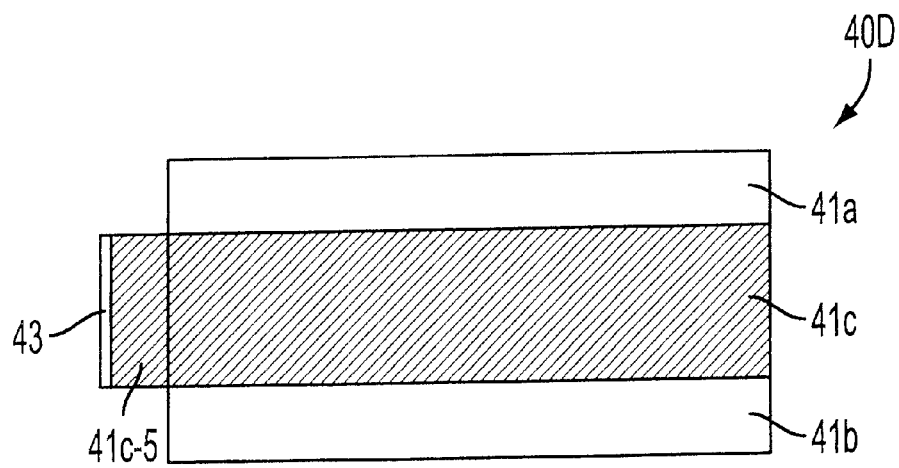
FIG. 8B is a side view of the vibration element in FIG. 8A.

FIGS. 8A and 8B are views of a vibration element of the vibration actuator according to a fourth preferred embodiment of the present invention. In this fourth embodiment, the vibration element 40D is formed with a drive force take-out portion 41c-5 from which the drive force is taken out upon the boundary between the electrodes 42a and 42b of the outer circumferential surface of the metallic plate 41c.

When the durability of the sliding movement surface of the drive force take out portion 41c-5 which is contacted against the relative moving member not shown in the figure is taken into serious consideration, it is desirable to provide a slide member 43 which has good friction enduring characteristics to the sliding movement surface of the drive force take out portion 41c-5.

In this manner, damage to the drive force take out portion 41c-5 does not occur in this fourth preferred embodiment, since this drive force take out portion 41c-5 is integrally fixed to the point of the metallic plate 41c, which is quite strong. Further, it is easily possible to extend the vibrational displacement by making the drive force take out portion 41c-5 longer and thinner gradually.

Figure 9A:
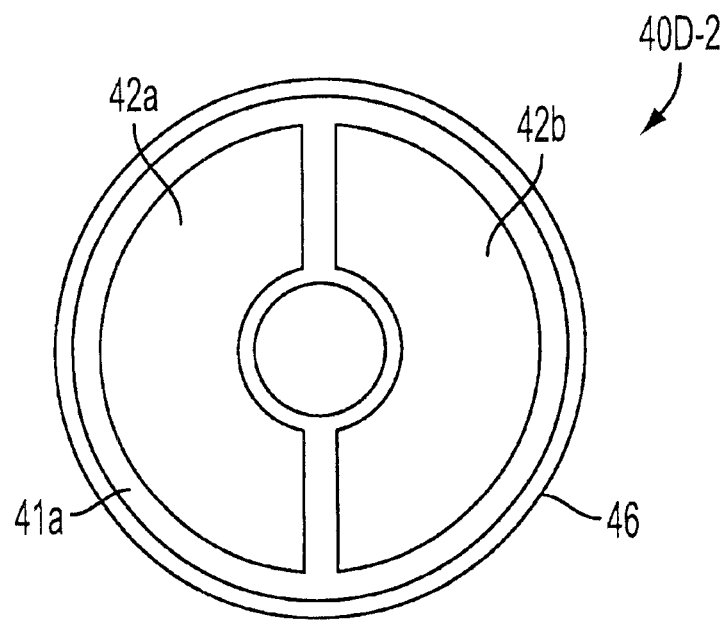
FIG. 9A is a plan view showing a vibration element of a variant in the fourth embodiment.
Figure 9B:
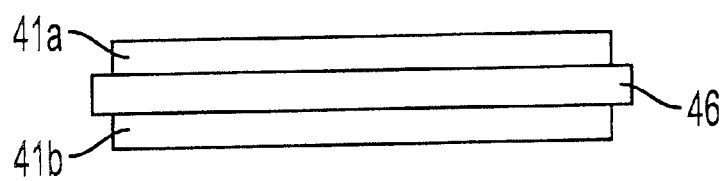
FIG. 9B is a side view of the vibration element in FIG. 9A.

FIGS. 9A and 9B are views showing a variant in the fourth embodiment. The vibration element 40D-2 employs the same ceramic piezoelectric elements 41a and 41b as those of the previously described vibration element 40, and a metallic plate 46 which has a diameter greater than the outer diameters of the ceramic piezoelectric elements 41a and 41b.

This metallic plate 46 functions as an elastic member which maintains the vibrating state and also functions as a slide member. In detail, the metallic plate 46 contacts a relative moving member not shown in the figures on its outer peripheral surface, and performs relative driving between the vibration element 40D-2 and this relative moving member. By being implemented in this embodiment, even without using any slide member, the ceramic piezoelectric elements do not come into direct contact with the relative moving member, and the sliding movement surface of the relative moving member is protected from being damaged by the ceramic piezoelectric elements. In this case, along with endowing the vibration element 40D-2 with sufficient strength, the material of the metallic plate 46 should be suitably selected in consideration of the coefficient of friction with the relative moving member, the frictional endurance and the like.

Since the vibration element 40D-2 shown in this variant embodiment uses the metallic plate 46 as the slide member in this manner, thereby the assembly of the vibration element becomes easy; and moreover it is possible to improve its reliability, because falling off of the sliding movement member or the like cannot occur. Furthermore, since no portion of the slide member projects outwards, the shape of the vibration element becomes symmetric, and the balance of the vibration which is excited is improved, so that it is possible to enhance the drive efficiency.

Fifth Embodiment

Figure 10A:
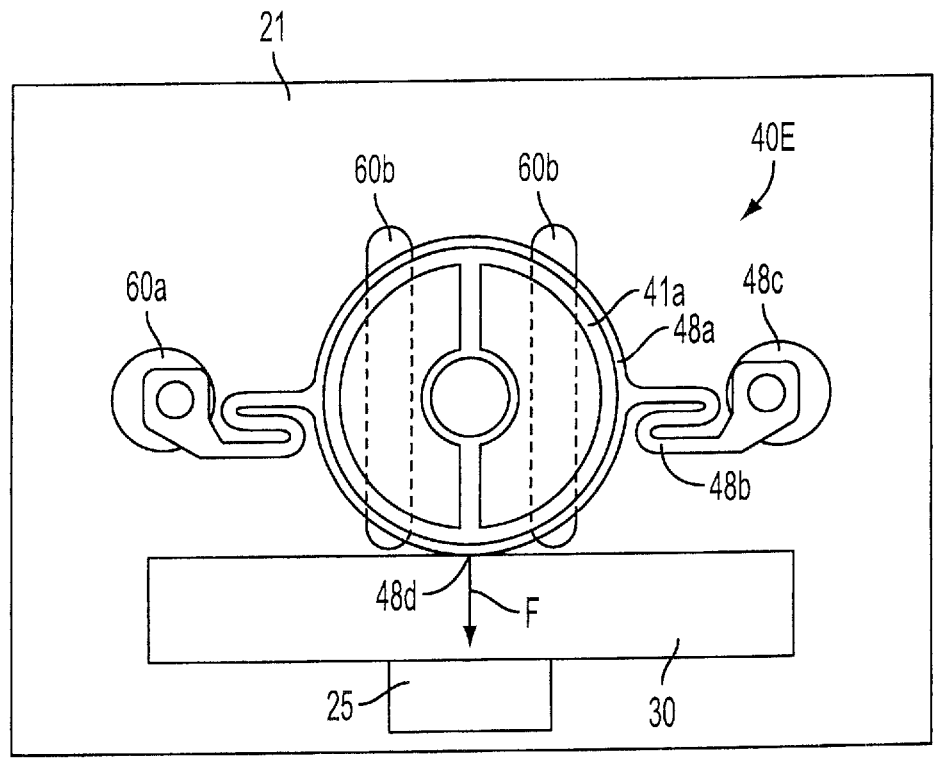
FIG. 10A is a plan view of a vibration actuator according to a fifth embodiment.
Figure 10B:
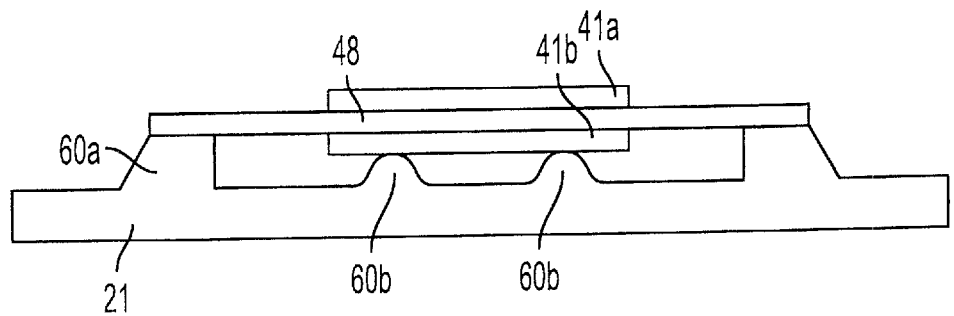
FIG. 10B is a side view of a vibration element in the FIG. 10A.

FIGS. 10A and 10B are views showing a vibration element of the vibration actuator according to a fifth embodiment of the present invention and peripheral structures thereof. FIG. 10A is a plan view of the vibration element 40E, and FIG. 10B is a side view thereof.

The metallic plate 48 of the vibration element 40E in this fifth preferred embodiment is formed with pressure application portions 48b and fixing support portions 48c.

The metallic plate 48 is made from a material of high elasticity. In the preferred version of this embodiment, phosphor bronze is used. Thus, the pressure application portions 48b and the fixing support portions 48c are formed from portions of the metallic plate 48 elongated in the radial direction which are bent around and are made springy. In other words, the pressure application portions 48b project mutually symmetrically from the metallic plate 48 in directions roughly perpendicular with respect to the direction of the applied pressure F upon the vibration element 40E and bend to be formed in a desired shape.

The fixing support portions 48c are provided outwards in the radial direction from the pressure application portions 48b. The vibration element 40E is fixed via the fixing support portions 48c by fixing screws which are not shown in the figures to bosses 60a provided upon the base member 21. And the pressure application portions 48b are maintained in the appropriately bent states to generate a predetermined pressing force F in a drive force take out portion 48d of the vibration element 40E.

Further, the metallic plate 48 also fulfils the function of a lead electrode for earthing by being in contact with the bosses 60a, since it is in contact with the entire surfaces of the electrodes of the two ceramic piezoelectric elements 41a and 41b.

Moreover, ribs 60b are provided upon the base member 21 along the portion over which the vibration element 40E is fitted. These ribs 60b are contacted against the bottom surface of the vibration element 40E, and impede displacement of the vibration element 40E due to the displacement of the relative moving member 30. It is to be noted that it would also, as an alternative, be acceptable to form the base member 21 so that the ribs 60b contacted the surfaces of the vibration element 40E on both its sides.

Figure 11A:
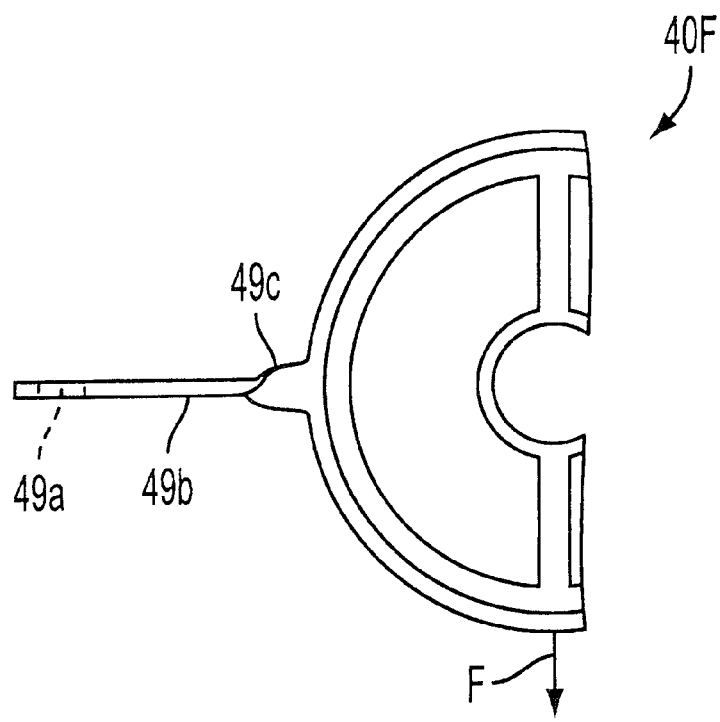
FIG. 11A is a partial plan view showing a vibration element of a variant in the fifth embodiment.
Figure 11B:
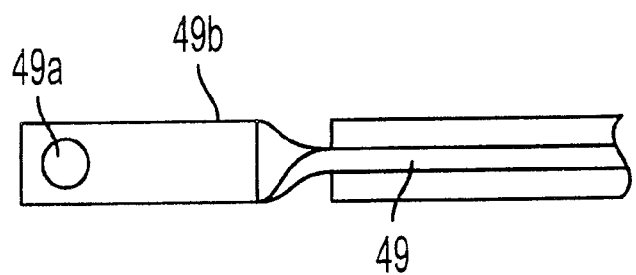
FIG. 11B is a partial side view of the vibration element in FIG. 11A.

FIGS. 11A and 11B are views showing a variant in the fifth embodiment.

The plate thickness of the metallic plate 48 of the vibration element 40E shown in FIGS. 10A and 10B was shown by way of example as being comparatively thick, but the vibration element 40F shown in FIGS. 11A and 11B is an embodiment in which the plate thickness of the metallic plate element 49 is comparatively thin. This metallic plate 49 is made from phosphor bronze as was the metallic plate 48.

Pressure application portions 49b are formed by extending symmetrically certain portions of the metallic plate 49 in directions roughly perpendicular to the direction of the applied pressure force F on the vibration element 40F. In order to make the plate thickness direction (the direction of bending) of the pressure application portions 49b roughly agree with the direction of the applied force F, the extended metallic plate 49 are twisted around through 90° at the twisted portions 49c. Fixing holes 49a are provided at the ends of the pressure application portions 49b, and the vibration element 40F is fixed to a fixed element not shown in the figures using these fixing holes 49a. Accordingly, it is possible to fixedly support the vibration element 40F to a base plate. Furthermore, a relative moving member can be pressured by taking advantage of the restoring force which is generated when the pressure application portions 49b are deformed.

Now, with the conventional vibration actuator which was previously described, as shown in FIGS. 21C and 21D, the positions of the nodes (the points A, B1, and B2) of the two vibration modes are different. Accordingly, when fixed support of the vibration element is firmly performed, the problem arises that the vibrations are damped so that the drive efficiency is deteriorated. In particular, when a vibration actuator of small size is fixed firmly using screws or the like, a possibility also arises of damage, since the vibration element is a thin plate. By contrast, if such a vibration actuator is loosely supported so that play can occur, the problem arises that the controllability of positional determination is deteriorated, so that it cannot be stably driven.

On the other hand, with such a prior art vibration actuator, since the pressing mechanism for pressing its vibration element into contact with the relative moving member is provided specially, the problem arises that, even if the size of the vibration element is reduced, it is not possible to make the entire size small, because it is necessary to provide a pressing mechanism in addition to the structures including the vibration element.

However, with the vibration actuators in the above described fifth preferred embodiment, it is possible to realize an extremely thin drive apparatus in which no complicated pressing apparatus is required, since the metallic plates 48 and 49 are endowed with the function of the fixing support portions and pressing elements which generate pressing force.

Further, since the vibration elements 40E and 40F are supported via elastic members and the vibrations of the vibration elements 40E and 40F are not damped, therefore it is possible to enhance the drive efficiency, and moreover a high level of controllability can be ensured, since there is no play in the support structure.

A Variant Embodiment

The present invention is not to be considered as being limited to the embodiments described above; various other variants and changes are also possible and they are equally included within its range.

For example, the vibration element 40 was described as having employed a set of a superimposed layer structure in which the metallic plate 41c was sandwiched between the pair of ceramic piezoelectric elements 41a and 41b, but, as an alternative, it would be acceptable to provide two or more such a layer structure. In this case, it would be suitable to omit one of the ceramic piezoelectric element layers which are opposite to each other and each of which is included in each layer structure, in other words, to provide a superimposed layer structure in which n metallic plates are alternatingly sandwiched between n+1 ceramic piezoelectric elements.

It is to be noted that, the embodiments and variants described above all employed a superimposed layer structure in which a single metallic plate was sandwiched between a pair of ceramic piezoelectric elements. However this is not to be considered as limitative of the present invention, which also includes the case of a superimposed layer structure in which a single piezoelectric element is sandwiched between two metallic plates.

Furthermore, although the electrical energy to mechanical energy conversion element was described as being a ceramic piezoelectric element, it could also be an electrostriction element or a magnetostriction element.

Since according to this embodiment, as described in detail above, the structure is such that both the sides of the elastic member are sandwiched between and are supported by the electrical energy to mechanical energy conversion elements, therefore, along with the rigidity of the vibration element as a whole being enhanced due to the front and rear symmetry, also unnecessary bending vibration in the plane other than the relevant plane of the vibration element is prevented, and drive which is relatively efficient in terms of the drive voltage becomes possible.

Yet further, since it is possible to enhance the thinness of the electrical energy to mechanical energy conversion element while maintaining high rigidity, therefore drive at low supplied voltage becomes possible, and moreover a sufficient output can be obtained by disposing electrodes of the electrical energy to mechanical energy conversion elements upon both sides.

And, furthermore, since an elastic member is used which is strong, it becomes possible to realize a drive apparatus of outstandingly small size even while maintaining a simple structure, by taking advantage of the elastic member not only as a support for the vibration element but as a drive force take out portion as well.

Still yet further, by obtaining pressing force by taking advantage of the elasticity of a portion of the elastic member, since this portion also serves as a support portion for the actuator as well and provides fixed support without allowing any play, thereby it is possible to obtain suitable pressing force without damping the vibrations of the vibration element, and it becomes possible to construct a vibration actuator of high efficiency and small size which has a particularly thin form and moreover has high controllability.

Sixth Embodiment

Figure 12:
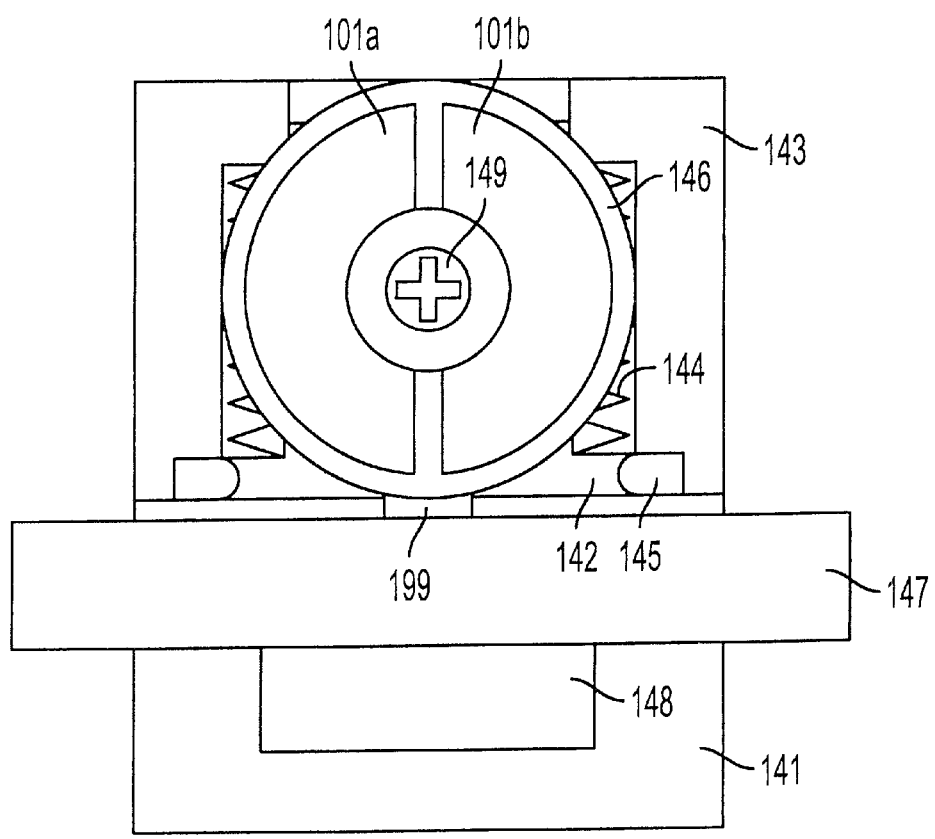
FIG. 12 is a plan view showing a vibration actuator according to a sixth embodiment.
Figure 13A:
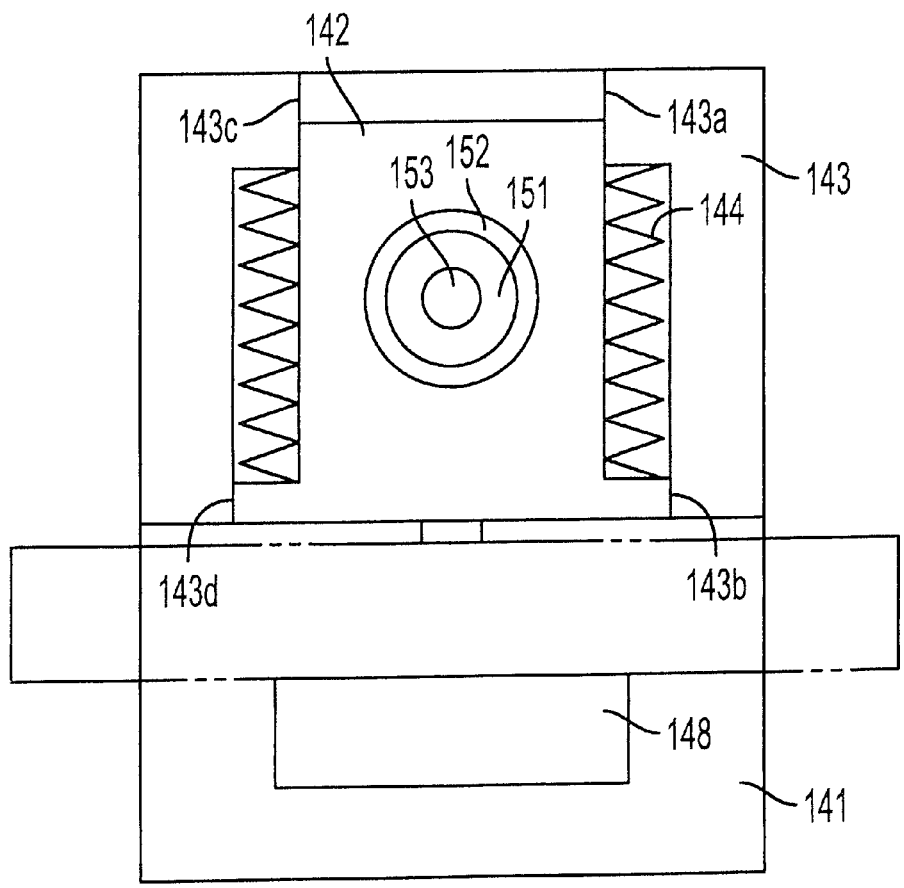
FIG. 13A is a plan view showing an apparatus for supporting the vibration actuator in FIG. 12.
Figure 13B:
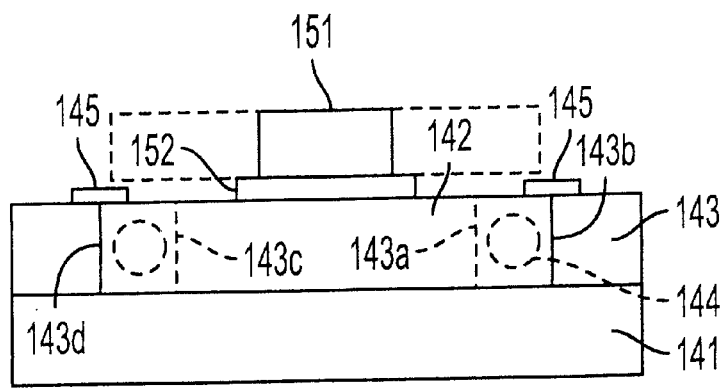
FIG. 13B is a side view of the support apparatus in FIG. 13A.

FIGS. 12 and 13 are figures for explanation of the vibration actuator according to a sixth embodiment of the present invention. FIG. 12 is a plan view of the vibration actuator; FIG. 13A is a plan view showing a vibration element support apparatus which extracts a vibration element from a vibration actuator shown in FIG. 12; and FIG. 13B is a side view of the vibration element support apparatus shown in FIG. 13A.

Silver electrodes 101a and 101b and a slide member 199 are provided to a vibration element 146, and a drive signal is input from a drive circuit not shown in the figures via terminals not shown in the figures either. The vibration element 146 to which this drive signal is input harmoniously undergoes vibrations in a radial symmetric expansion vibration mode and a non-axisymmetric planar vibration mode, and generates an elliptic motion at a surface of the slide member 199 which opposes a movable element 147. This movement is the same as the movement explained with reference to FIGS. 21A through 21D. This type of vibration element 146 can be utilized as the vibration element explained with reference to FIGS. 1 through 9, but a different type of vibration element is also acceptable, provided that it is one which harmoniously undergoes vibrations in a radial symmetric expansion vibration mode and a non-axisymmetric planar vibration mode.

The vibration element 146 is fixed to a support post 151 by a screw 149. That is, the vibration element 146 is mounted upon a stand 152 which is provided upon a movable block 142, and is fixed by the screw 149 to the support post portion 151 which has a height somewhat lower than the thickness of the vibration element 146 and a diameter almost the same as the inner diameter of the vibration element 146. Since the screw 149 fixes the vibration element 146 at its radially innermost upper circumferential portion, the vibration element 146 is held without play, and moreover it is possible to fix the vibration element 146 without impeding its vibration.

The movable block 142 is slidably disposed upon the base 141, and the movable block 142 and the base 141 are both superimposed in the direction perpendicular to the plane of vibration of the non axially symmetric planar vibration mode of the vibration element 146. Further, the movable block 142 can only be displaced in a predetermined direction which is determined by engagement surfaces 143a through 143d of a guide 143. Moreover, stoppers 145 are provided in the direction opposing the base 141, and these prevent the movable block 142 from parting from the guide faces 143a through 143d.

Between the movable block 142 and the guide 143 there are provided two springs 144 which extend along predetermined tracks, being restrained by both the guide faces 143a and 143b and both the guide faces 143c and 143d of the guide 143. One end of each of these springs 144 bears against the guide 143 while its other end pushes against the movable block 142, and accordingly the vibration element 146 which is fixed to the movable block 142 is urged by the urging force of the springs 144 towards the movable element 147 which functions as a relative moving member. Since the springs 144 extend along their predetermined paths while being restrained by the guide faces 143a through 143d of the guide 143, it is possible for the urging force due to the springs 144 to be transmitted to the vibration element 146 with high efficiency. Further, since the springs 144 are respectively disposed along both the guide faces 143a and 143b and both the guide faces 143c and 143d of the guide 143, therefore it is possible for the movable block 142 to be smoothly urged without any risk that the movable block 142 may jam against one side of the guide faces 143a through 143d. Yet further, it is possible to lower loss even if the direction of urging has deviated, since the springs 144 are urged at positions close to the drive point (the contact point of the slide member 199 and the displacement element 147). In other words, even if deviation occurs in the urging force of the springs 144, it is difficult for any influence to be exerted upon the contact pressing force between the movable block 142 and the movable element 147.

On the other hand, the movable element 147 is supported by a linear guide 148 so as to be freely displaceable along the direction of the drive force of the vibration element 146, almost in parallel with the upper surface of the base 141.

In this embodiment, the springs 144 are provided behind the vibration element, in other words within a region which is defined by projecting the vibration surface of the vibration element 146 upon the base 141, but it would be acceptable for them to be outside this projected region, provided that they were in the vicinity of the projected region.

Seventh Embodiment

Figure 14A:
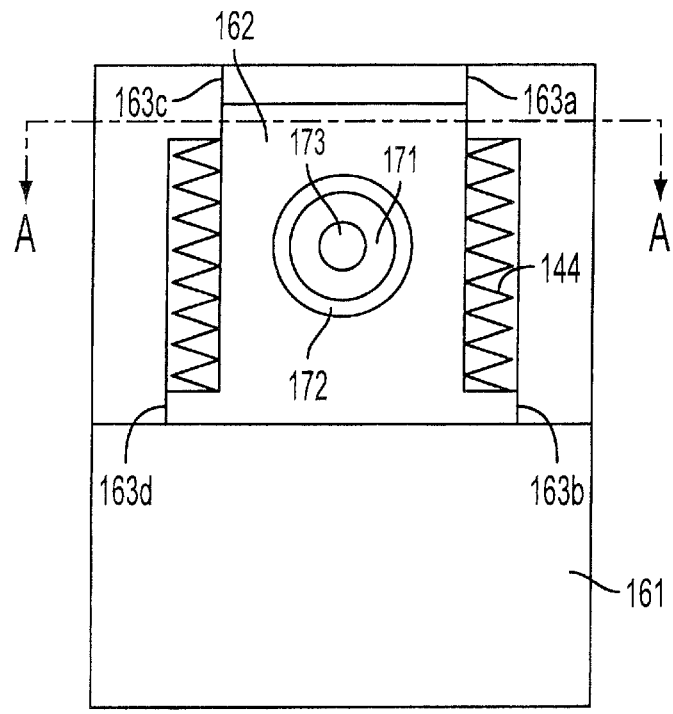
FIG. 14A is a plan view showing a variant support apparatus for a vibration actuator in a seventh embodiment.
Figure 14B:
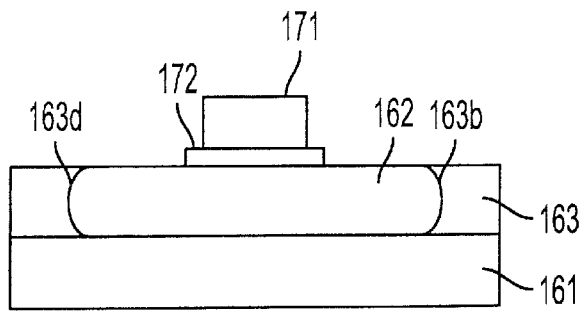
FIG. 14B is a side view of the support apparatus in FIG. 14A.
Figure 14C:
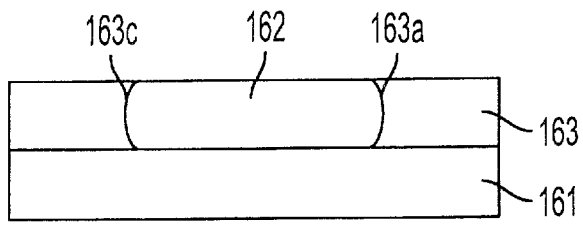
FIG. 14C is a sectional view of the apparatus in FIG. 14A taken along the line A–A' in that figure.

FIGS. 14A through 14C are figures showing a seventh preferred embodiment of the vibration actuator according to the present invention; FIG. 14A is a plan view of a vibration element support apparatus, FIG. 14B is a side view thereof, and FIG. 14C is a sectional view thereof taken along the line A—A. The method of support for the vibration element 146 in this embodiment, and the urging method for the vibration element, are the same as in the sixth preferred embodiment disclosed above, and accordingly the description thereof will be curtailed.

The point in which this seventh embodiment differs from the sixth embodiment is the guide structure for the movable block, here denoted as 162. In this embodiment, guide surfaces 163a through 163d of a guide 163 are formed as concave surfaces, and surfaces of the movable block 162 are formed as convex surfaces which engage with guide surfaces 163a through 163d. The following beneficial operational results are obtained by implementing the fitting together of the movable block 162 and the guide 163 by this convex-concave engagement structure.

①The stoppers 145 which were required in the sixth embodiment become unnecessary, so that a reduction in cost can be anticipated.

②Even if the apparatus is used in a tilted orientation, the pressure is always applied smoothly.

It should be noted that, although in this seventh embodiment the engagement surfaces are made as a smooth concave surface and a smooth convex surface, it would be possible to obtain the same beneficial effects, even if steps were provided upon the engagement surfaces.

Eighth Embodiment

FIGS. 15A through 15C are figures showing an eighth preferred embodiment of the vibration actuator according to the present invention; FIG. 15A is a plan view of a support apparatus for the vibration actuator, FIG. 15B is a side view thereof, and FIG. 15C is a sectional view taken along the line B—B in FIG. 15A. The method of support for the vibration element 146 in this embodiment is the same as in the sixth and seventh preferred embodiments disclosed above, and accordingly the description thereof will be curtailed.

The aspect in which this eighth embodiment differs from the sixth and seventh embodiments described above is that a guide groove 190 is provided in a base 181 which contacts a movable block 182, and an engagement claw 185 which is engaged into the guide groove 190 is provided to the movable block 182. In this embodiment, a spring 144 is fitted into the guide groove 190 and biases the engagement claw 185 of the movable block 182. In this embodiment, play of the movable block 182 is suppressed by increasing the length of the engagement claw 185 along the direction of pressure application. It would be also possible to suppress play of the movable block 182 even more effectively by providing a plurality of such engagement claws 185 along the pressure application direction. In such a case, it would also be suitable to provide holes pierced through these engagement claws 185 for allowing passage of the spring 144.

Further, in this eighth preferred embodiment, the engagement claw 185 is prevented from coming out of the guide groove 190, due to the weight of the movable block 182 itself. However, if the apparatus is to be used with the base 181 in a tilted orientation, it would be desirable to provide a stopper, just as in the case of the sixth embodiment described above, for example.

The present invention is not to be considered as being limited to the sixth through the eighth embodiments described above. Various variations and alterations are possible without departing from the scope of the present invention. For example:

(1) Although in the sixth through the eighth embodiments described above biasing force were used in the direction to separate the two members which were contacted by both ends of the spring, it would also be acceptable to use biasing force in the direction to pull together two members which were connected to both ends of the spring.

(2) Although in the sixth through the eighth embodiments described above a spring was taken advantage of as the biasing member, a rubber member or the like could also be utilized, or a biasing means could be employed which performed biasing by taking advantage of the gravity force working on a weight via a pulley.

As described in detail above, according to this embodiment, since the vibration element which is executing vibration in a plane is supported so as to be able to be displaced in a direction in that plane and pressing force is applied from the side of the vibration element, therefore no unnecessary play is generated in a movement of the relative moving member, and it is possible to obtain a vibration actuator which can operate smoothly. Moreover, it is possible to reduce the size of the vibration actuator according to the present invention.

Ninth Embodiment

Figure 16A:
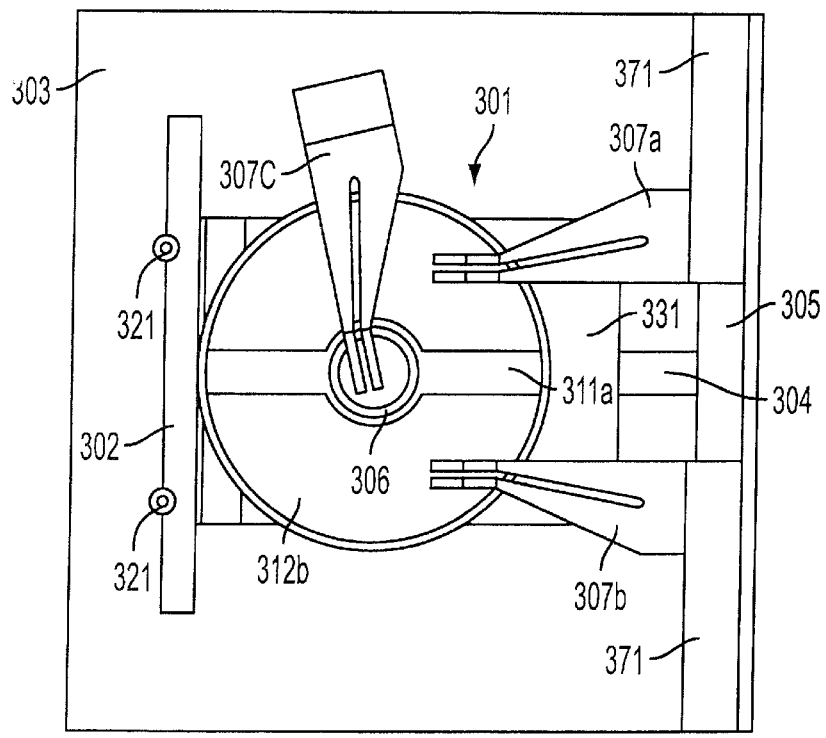
FIG. 16A is a plan view showing a vibration actuator according to a ninth embodiment.
Figure 16B:
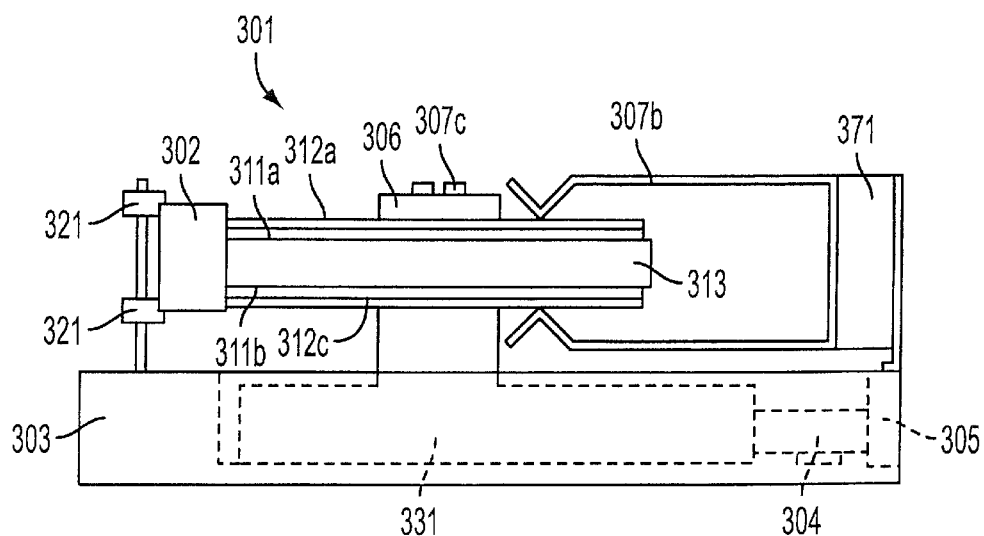
FIG. 16B is a side view of the vibration actuator in FIG. 16A.

Next a ninth preferred embodiment of the vibration actuator according to the present invention will be explained with reference to FIGS. 16A and 16B. FIGS. 16A and 16B are overall structual views of the vibration actuator, and FIG. 16A is a plan view of the vibration actuator, while FIG. 16B is a side view of the vibration actuator.

This vibration actuator comprises a vibration element 301, a relative moving member 302 which undergoes movement relative to the vibration element 301, electrode terminals 307a, 307b and 307c which supply electricity to the various electrodes provided to the vibration element 301, a support member 306 which supports the vibration element 301 via a central hole of the vibration element 301, a movable base plate 331 to which the vibration element 301 is fixed by being supported by a support member 306, and a fixed base plate 303 which supports the vibration actuator as a whole.

Moreover, the vibration element 301 comprises electrical energy to mechanical energy conversion elements 311a and 311b and an elastic member 313, electrodes 312a and 312b which are provided to the electrical energy to mechanical energy conversion element 311a, and electrodes 312c and 312d (not shown in the figures) which are provided to the electrical energy to mechanical energy conversion element 311b. Each of the electrical energy to mechanical energy conversion elements 311a and 311b is shaped as a circular plate with a central hole. And, as shown in FIG. 16B, each of the electrical energy to mechanical energy conversion elements 311a and 311b is a ceramic piezoelectric element of the same thickness. Further, the elastic member 313 is of a circular plate shape with a central hole and has an outer diameter which is larger than the electrical energy to mechanical energy conversion elements 311a and 311b, and is formed from phosphor bronze which has a high Q value. And, as shown in FIG. 16B, the electrical energy to mechanical energy conversion elements 311a and 311b are stuck to the upper and lower surfaces of the elastic member 313.

And the electrodes 312a through 312d are provided upon the surfaces of the ceramic piezoelectric elements 311a and 311b which are opposite to their surfaces to which the elastic member 313 is stuck. In detail, the electrodes 312a and 312b are provided to the electrical energy to mechanical energy conversion element 311a as separated in the radial direction. And in the same manner the electrodes 312c and 312d are provided to the electrical energy to mechanical energy conversion element 311b as separated in the radial direction. It is to be noted that the electrode 312d is not shown in the figures. The pattern of formation of the electrodes 312c and 312d is the same as the pattern in which the electrodes 312a and 312b are formed.

Figure 17A:
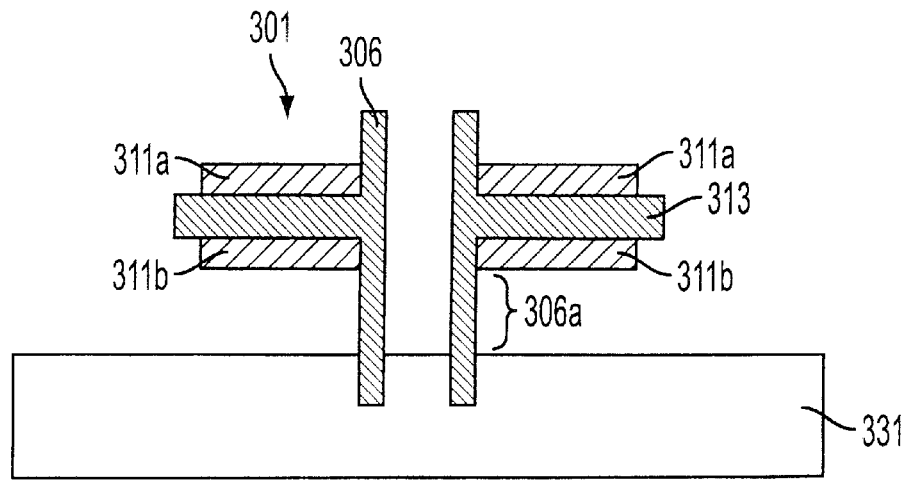
FIG. 17A is a sectional view of the vibration element and a support member in the ninth embodiment.

The vibration element 301 which has this type of structure is axially supported by a support member 306 in a central hole in the vibration element 301. This support member 306 is made from the same material as the elastic member 313, and, as shown in FIG. 17A, is formed integrally with the elastic member 313. And one end of the support member 306 is fixed to the base plate 331. FIG. 17A is a sectional view taken in the radial direction of the vibration element 301 as supported by the support member 306. As shown in FIG. 17A, the vibration element 301 is supported by the support member 306 in a position which is separated from the movable base plate 331 by a predetermined distance. It is to be noted that, in the support member 306, an elastic portion 306a which is easily deformable is formed between the portion on which the vibration element 301 is formed and the portion to which the movable base plate 331 is fixed.

A spring member 304 is provided on the surface of the movable base plate 331 on the side to which the vibration element 301 is fixed, as shown in FIG. 16A, and one end of the spring member 304 is contacted against the movable base plate 331. And a spring fixing portion 305 which is fixed to this spring member 304 is provided to the other end of the spring member 304. The spring member 304 is provided between the spring fixing portion 305 and the movable base plate 331 and biases them.

The movable base plate 331 is provided so as to be slidable upon a concave portion which is formed on the fixed base plate 303. And the movable base plate 331 can be displaced in the leftward and rightward directions as seen in FIG. 16A along this concave portion. It is to be noted that, as previously explained, the movable base plate 331 is pressed in the leftward direction as seen in FIG. 16A by the spring member 304. The relative moving member 302 which moves relative to the vibration element 301 is provided at the space lying in this pressing direction. Accordingly, the vibration element 301 is pressed by the relative moving member 302 due to the spring member 304 pressing the movable base plate 331.

Bearings 321 with flanges are provided to the surface of the relative moving member 302 on the opposite side to the surface upon which it is thus pressed. Accordingly, the relative moving member 302 is squeezed between the vibration element 301 and the bearings with flanges 321 and is supported thereby. It is to be noted that the bearings with flanges 321 are fixed to the fixed base plate 303.

In this vibration actuator, plate spring electrodes 307a and 307b are provided in order to supply electricity to the electrodes 312a, 312b, 312c, and 312d. The plate spring electrode 307a is arranged so as to make contact with the electrode 312a which is provided on the front surface of the vibration element 301 and the electrode 312d which is provided on its rear surface. In the same manner, the plate spring electrode 307b is also arranged so as to make contact with the electrode 312b which is provided on the front surface of the vibration element 301 and the electrode 312c which is provided on its rear surface. This plate spring electrode 307a and plate spring electrode 307b are both electrically connected to a drive circuit which is not shown in the figures. As a drive circuit, for example, the circuit shown in FIG. 3 may be used. The AC voltages supplied from the drive circuit are supplied via the plate spring electrode 307a and the plate spring electrode 307b to the electrodes 312a and 312d, and to the electrodes 312b and 312c, of the vibration element 301. It is to be noted that the plate spring electrodes 307a and 307b are fixed to the fixed base plate 303 via an insulating member 371.

Further, a plate spring electrode 307c is contacted against the upper end of the support member 306, so as to bring the electrical potential which is applied to the elastic member 313 to electric ground potential. In this manner, the elastic member 313 also fulfils the role of a ground electrode for the electrical energy to mechanical energy conversion elements 311a and 311b.

With a vibration actuator having this type of structure, AC voltages whose phases differ by 90° are respectively supplied to the plate spring electrodes 307a and 307b. By doing this the electrical energy to mechanical energy conversion elements 311a and 311b are caused repeatedly to expand and contract, and vibrations are excited in a radial symmetric degenerate vibration mode (the (R,1) mode) in which waves of expansion and contraction are generated from the central hole of the vibration element 301 in a radial direction, and in a non-axisymmetric degenerate vibration mode (the ((1, 1)) mode) in which the vibration element 301 bends to and fro in a non-axisymmetric manner in the same plane that generated the above ((R,1)) mode. When these two different types of vibration mode are excited in the vibration element 301, an elliptic motion (as shown in FIGS. 21A through 21D) is generated at its contact portions with the relative moving member 302, so that it is possible to impart a propelling power to the relative moving member 302.

With this vibration actuator according to this ninth preferred embodiment, it is possible to make it difficult for the vibration energy excited in the vibration element 301 to be transmitted to the movable base plate 331 by providing the elastic portion 306a to the support member 306 of the vibration element 301. Accordingly, the amount of vibration energy which is undesirably dissipated due to the vibration of the movable base plate 331 is reduced, and it is possible to excite the vibration element 301 at high efficiency.

Further, the thickness of the elastic portion 306a of the support member 306 in this embodiment of the present invention may be about 50 µm, and its length from the portion which is fixed to the movable base plate 331 to the portion of which the vibration element 301 is formed may be equal to or greater than 1 mm. Accordingly, elastic deformation of the elastic portion 306a following the vibrations generated in the vibration element 301 is also made possible, and it is ensured that the deformation which accompanies the vibrations of the vibration element 301 does not greatly extend its influence as far as the portion which is fixed to the movable base plate 331. Accordingly, the vibration transferred to the movable base plate 331 is very much reduced.

Figure 17B:
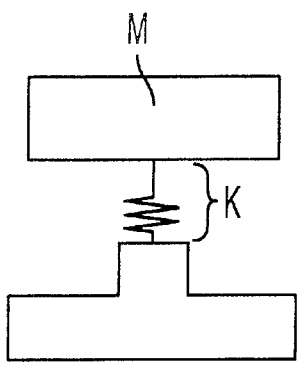
FIG. 17B is a schematic figure for explanation of the theory in the ninth embodiment.

Further, in this ninth preferred embodiment of the vibration actuator according to the present invention, it is arranged that the following conditions are satisfied when forming this elastic portion 306a. Explanation of these conditions will be made with reference to FIG. 17B. The resonance frequency of the system which is made up from the mass M of the vibration element 301 and the rigidity K (the spring constant) of the elastic portion 306a of the support member 306 is set to be lower than the frequency of the vibrations which are excited in the vibration element 301. In particular, it is desirable that the ratio obtained by dividing the resonance frequency of the system made up from the mass M of the vibration element 301 and the rigidity K of the elastic portion 306a of the support member 306, by the frequency of the vibrations which are excited in the vibration element 301, should have a value less than the reciprocal of the square root of 2. When this condition is satisfied, the efficiency with which the vibration excited in the vibration element 301 is transmitted to the movable base plate 331 is low. Accordingly it becomes possible to reduce the proportion of the vibration energy obtained from the vibration element 301 which is transmitted to the movable base plate 331, and the vibration of the vibration element 301 is not restricted, even if the support member 306 is firmly fixed to the movable base plate 331.

As described above, in this ninth preferred embodiment of the vibration actuator according to the present invention, the elastic portion 306a is formed of phosphor bronze which is metal. In particular, since phosphor bronze has low resonant vibration hysteresis. The energy obtained by elastic deformation due to the vibration excited in the vibration element 301 is almost not decreased at all, and is almost all re-supplied to the vibration element 301. Accordingly, since even the vibration which has been imparted to the support member 306 is returned to excite the vibration element 301 again, the amount of vibration energy which is wasted is minimized.

Further, with this vibration actuator, since the support member 306 and the elastic member 313 of the vibration element 301 are integrally formed, the vibration of the vibration element 301 is directly transmitted to the elastic portion 306a in the support member 306. Accordingly, loss of vibration energy at the contact portions between the support member 306 and the vibration element 301 is small, and vibration is efficiently transmitted to the elastic portion 306a; and, moreover, when the elastic portion 306a returns to its normal shape, the loss becomes very small, since this energy is directly transmitted to the elastic member 313 of the vibration element 301.

Further, in this ninth embodiment of the present invention, the vibration element 301 is supported at its central hole, at which the displacement due to vibration is extremely small in the vibration element 301. Accordingly it is possible for a vibration actuator having the vibration element 301 vibrating with no vibration nodes to reduce an influence of hampering the vibration.

In this manner, with this vibration actuator according to the present invention, even without supporting the vibration element 301 at its nodes of vibration, the vibration of the vibration element 301 is hardly hampered at all.

Further, in this ninth embodiment of the present invention, the support member 306 is shaped as a circular cylinder. By this shape, it is possible to make the support member 306 extremely thin so as to be able to realize high elasticity when deformation occurs thanks to vibration mode, while maintaining high rigidity, with respect to the shear deformation of the support member 306 generated between the vibration element 301 and the movable base plate 331 when the vibration element 301 is pressed towards the relative moving member 302.

Further, with the vibration actuator according to this ninth embodiment of the present invention, the following beneficial aspects are available. With the vibration actuator in this embodiment of the present invention, each of the plate spring electrodes 307a and 307b is C-shaped, in order as described above to supply electrical power to each of the electrodes of the vibration element 301. And the two arm portions of the C-shaped plate spring electrode 307a are contacted against the electrodes 312a and 312d of the vibration element 301. Similarly, the two arm portions of the C-shaped plate spring electrode 307b are contacted against the electrodes 312b and 312c of the vibration element 301. The interval between the contact points of the plate spring electrodes 307a and 307b, i.e. their contact points against the electrodes of the vibration element 301, is narrower than the thickness of the vibration element 301. The vibration element 301 is inserted between the plate-like spring electrodes 307a and 307b, so that the plate-like spring electrodes 307a and 307b pinch and contact against the surfaces provided upon the electrodes of the vibration element 301. Since the vibration element 301 executes resonant vibration in a direction parallel to the surfaces to which the electrodes are provided, and the plate spring electrodes 307a and 307b press into contact in a direction perpendicular to the direction in which the vibration element 301 executes resonant vibration, therefore the contact between the electrodes of the vibration element 301 and the plate spring electrodes 307a and 307b is securely and reliably performed.

It should be noted that, in order even more securely to contact these plate spring electrodes 307a and 307b against the electrodes of the vibration element 301, the end portions of the plate spring electrodes 307a and 307b are divided into two. Accordingly the contact with the electrodes of the vibration element 301 is even better assured, since it is possible to make contact against a single electrode which is provided upon the vibration element 301 at two points.

The present invention is not to be conceived of as being limited to the vibration actuators in the embodiments described above. In the following, certain further variant embodiments of the vibration actuator according to the present invention will be described.

Figure 17C:
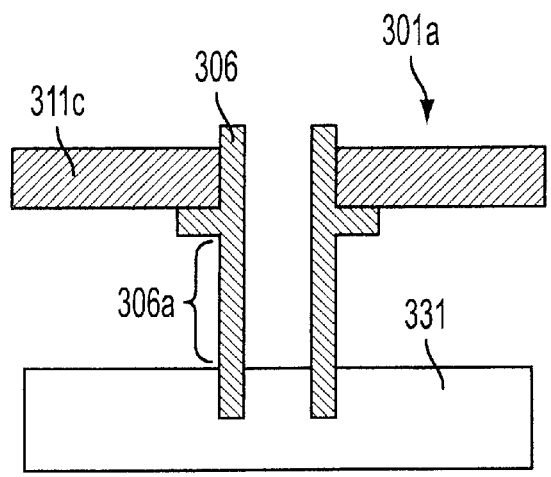
FIG. 17C is a sectional view of a vibration element and a support member of a variant in the ninth embodiment.

One of these variant embodiments is directed to a vibration element 301a of which FIG. 17C is a sectional view. This vibration element 301a does not utilize any elastic member 313 like that shown for the previously described vibration element 301, and comprises only an electrical energy to mechanical energy conversion element 311c. And this electrical energy to mechanical energy conversion element 311c is directly supported by a support member 306 which comprises an elastic portion 306a. If the vibration element 301 is provided at the support member 306 which comprises the elastic portion 306a in this manner, then, as described above, attenuation of the vibration energy of the vibration element 301 can be prevented even without providing any elastic member like the elastic member 313 in the previously described embodiments, since the vibration energy which is generated by the vibration element 301 is not transmitted to the base plate 331.

In the variant embodiment shown in FIG. 17C, the electrical energy to mechanical energy conversion element 311c and the support member 306 are fixed together with adhesive. The adhesive used here should be an adhesive which does not attenuate vibrational energy much but has high strength. By this structure, the deformation which accompanies the vibration of the vibration element 301 is directly transmitted to the support member 306. As a result, it becomes possible for the strain energy which is accumulated in the shaft to be re-converted back into vibration of the vibration element 301.

Figure 18A:
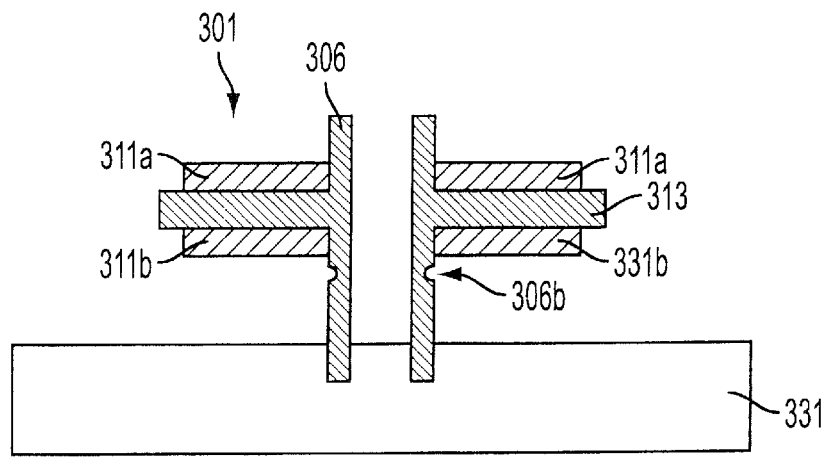
FIG. 18A is a sectional view of a vibration element and a support member of another variant in the ninth embodiment.

The shape of the elastic portion 306a in the support member 306 is not to be considered as being restricted to the shape shown in FIG. 17A. For example, as shown in FIG. 18A it would be acceptable for the elastic portion in the support member 306 to be made to be easily flexible. FIG. 18A is a sectional view of a vibration actuator comprising a support member 306b which is another variant in the ninth embodiment of the present invention. As shown in this figure, in this variant a necked portion 306b is provided upon the support member 306 between the vibration element 301 and the movable base plate 331, and this necked portion 306b functions as an elastic portion. If such a necked elastic portion 306b is thus provided, even if the other portions in the support member 306 are relatively thick, as described above, the transmission of the vibration energy of the vibration element 301 to the movable base plate 331 is greatly reduced.

Figure 18B:
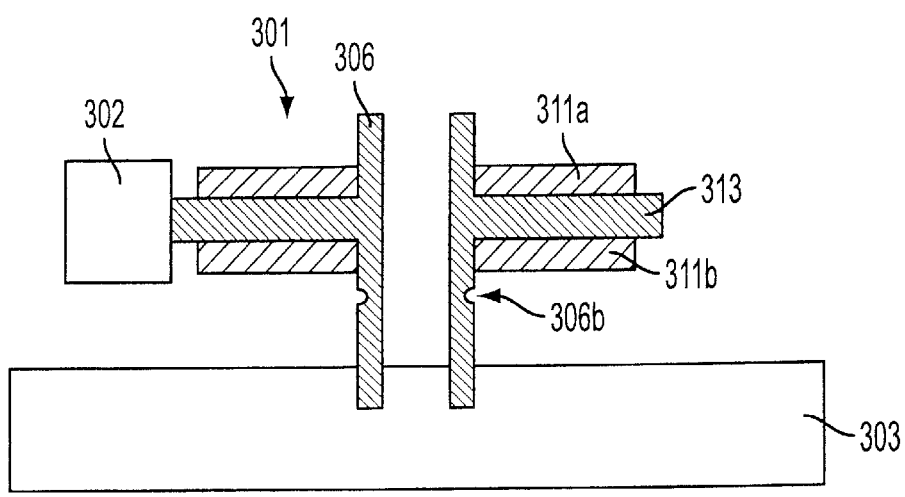
FIG. 18B is a sectional view showing the vibration element and support member of further another variant in the ninth embodiment.

Further, when the vibration element 301 is pressed into contact with a relative moving member 302, it is possible to apply this pressure by taking advantage of the springiness of the elastic portion 306b in the support member 306. This concept is shown in FIG. 18B. If the positional relationship is set in this manner between the relative moving member 302 and the support member 306 so as to exert pressure against the relative moving member 302 while elastically distorting the elastic portion 306b in the support member 306, then, even though the support member 306 is fixed directly to the fixed base plate without using any movable base plate 331, it becomes possible to press the vibration element 301 into contact against the relative moving member 302. Consequently, grooves for sliding the movable base plate 331 or pressure springs are not necessary, and it becomes possible to realize a vibration actuator of small size, and moreover the cost can be kept extremely low.

Figure 19A:
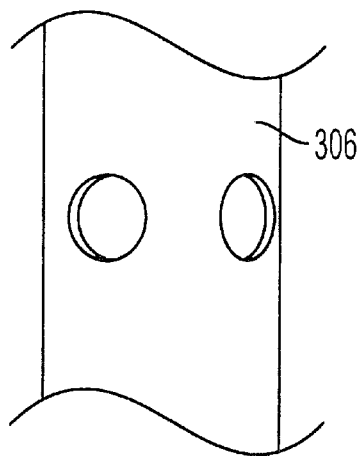
FIGS. 19A through 19C show other possible variants for the elastic portion of the support member.
Figure 19B:
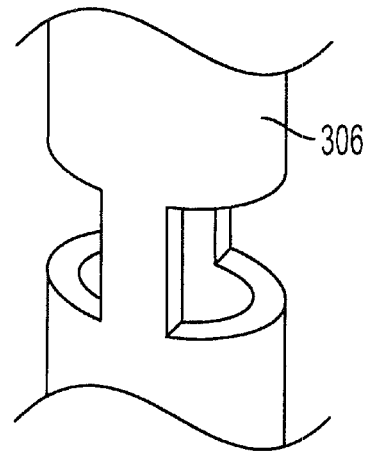
Figure 19C:
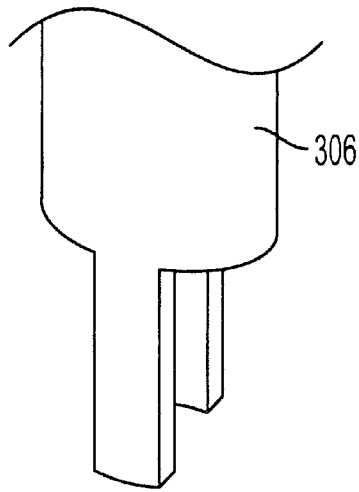

Further, the elastic portion in the support member 306 may have a shape which differs from the shape shown in FIGS. 18A and 18B. FIGS. 19A, 19B, and 19C show various such variant embodiments. In the example shown in FIG. 19A, the elastic portion in the support member 306 is formed with a number of holes. Further, in the example shown in FIG. 19B, the elastic portion in the support member 306 is very greatly cut away. And in the example shown in FIG. 19C, the end portion of the support member 306 is partly cut down. In this case shown in FIG. 19C, only a tip portion of a portion projecting from the end of the support member 306 is formed as an elastic portion by being fixed to the movable base plate 331.

Figure 20:
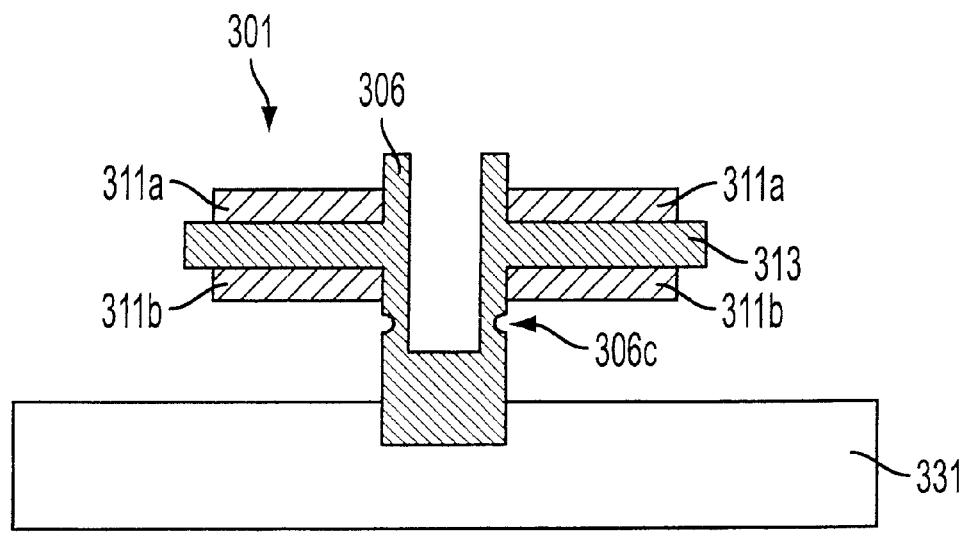
FIG. 20 is a sectional view of a vibration element and a support member of still yet another variant in the ninth embodiment.

With any of these structures, it is ensured that the vibration excited in the vibration element 301 is not transmitted to the member which fixes the support member 306. That is to say, any one of these structures will be acceptable, provided that the resonance frequency of the system made up from the mass M of the vibration element 301 and the rigidity K of the elastic portion 306a in the support member 306 comes to be less than the vibration frequency excited in the vibration element 301. Accordingly, provided that this condition is satisfied, as yet another possible variant embodiment, it will be acceptable for only the portion of the elastic portion 306c in the support member 306 and the portions which comprise the vibration element 301 to be made thin, and its other portions may be thick, as shown in FIG. 20.

The advantages in this ninth preferred embodiment of the present invention will now be explained in comparison with the prior art.

For example, when the vibration element is fixedly supported, there may be loss due to undesirable restriction of vibration, loss generated due to roughness of the sliding movement surface during transmission of movement to the relative moving member, loss caused by the weight of the lead wires for electrical supply and by undesirable increase of the weight due to solder stuck of these lead wires etc., and the like.

In particular, if the vibration element is fixedly supported, it is necessary to immobilize the vibration element so that it cannot be displaced as a whole, even during excitation of the vibration element. Due to this, it is necessary to support the vibration element with considerable firmness, and there is a risk that the vibration generated when exciting the vibration element will be suppressed owing to the method by which this support is performed.

In the prior art, with a standing wave type of vibration actuator, when supporting the vibration element, the method has been employed of fixing it at immobile points which become nodes at the amplitude of vibration. However, with the method in which vibration in both the different (R,1) and ((1,1)) degenerate modes is excited and a relative moving member is displaced, there is no compatible position between the nodes in the (R,1) vibration mode and the nodes in the ((1,1)) vibration mode. In particular, the (R,1) vibration mode has no nodes in its mode shape. Accordingly, rather than considering a method of support which does not hamper the vibration modes, from the viewpoint of simple shape of the parts and ease of assembly, the method is adopted of inserting a shaft in a central hole of the vibration element, and of fixing together this shaft and the vibration element by an adhesive.

When as in the prior art a shaft is inserted into the central hole of the vibration element and is fixed thereto with adhesive, the vibration of the vibration element is undesirably transmitted to the shaft and the base plate which supports the vibration actuator as a whole. In other words, the problem arises that the drive energy which is imparted to the relative movement member of the vibration element is undesirably reduced, since a part of the vibration energy excited by the vibration element is wasted as energy for vibrating the shaft and the base plate. There is a beneficial effect with regard to this point in the ninth preferred embodiment of the present invention described above, as follows.

When a vibration actuator like this one which has no nodes of vibration is supported by its vibration element which is shaped as a circular plate, it is supported by the support member at its central hole at which the vibration amplitude is the smallest, and moreover the vibration efficiency of the vibration element is enhanced by providing an elastic portion at the portion of the support member between the portion at which the vibration element is provided and the portion to which the base plate is fixed, so that consequently it becomes possible to increase the propelling power of the vibration actuator.

Although in the above the present invention has been shown and described in terms of the above first through the ninth embodiments thereof, the following combination of the various features disclosed is considered to yield the most desirable embodiment. Namely, as the vibration element, the vibration element 301 in the ninth preferred embodiment shown in FIG. 17A should be employed. And, as the support apparatus, the one in the sixth preferred embodiment shown in FIGS. 13A and 13B should be employed. The drive circuit shown in FIG. 3 should be employed.

What is claimed is:

1. A vibration actuator, comprising:
   a vibration element, which simultaneously generates a radial symmetric expansion vibration mode, such that said vibration element expands and contracts in a radial direction, and a non-axisymmetric planar vibration mode, such that said vibration element bends to and fro in a non-axisymmetric manner within a same plane as said radial symmetric expansion vibration is generated, wherein
      said vibration element includes at least one superimposed layer structure having an elastic member sandwiched between a pair of electrical energy to mechanical energy conversion elements, and
      front and rear surfaces of said elastic member are equally deformed by said pair of electrical energy to mechanical energy conversion elements,
   thereby driving a relative movement member.

2. The vibration actuator of claim 1, wherein said electrical energy to mechanical energy conversion elements and said elastic member are shaped as circular plates with central holes, and said elastic member is provided with a support member that supports said vibration element at at least one portion of an outer or inner circumference of said elastic member.

3. The vibration actuator of claim 1, wherein
   said electrical energy to mechanical energy conversion elements and said vibration element are shaped as circular plates, and said vibration actuator further comprises a drive force take out portion, formed to project outwards from an outer circumference of said elastic member, which transmits drive force obtained from vibration that is generated in said vibration element to said relative movement member.

4. The vibration actuator of claim 1, wherein a thickness of said elastic member is equal to or greater than a thickness of each of said electrical energy to mechanical energy conversion elements.

5. The vibration actuator of claim 1, wherein:
   each of said pair of electrical energy to mechanical energy conversion elements is provided with a plurality of electrodes that are inputted with AC voltages having a different phase to each other, respectively, and
   a set of said plurality of electrodes are symmetrically arranged relative to said elastic member.

6. The vibration actuator of claim 5, wherein among said plurality of electrodes of each of said pair of electrical energy to mechanical energy conversion elements, electrodes that are symmetrically arranged relative to said elastic member are respectively supplied with AC voltages in the same phase.

7. The vibration actuator of claim 1, wherein said electrical energy to mechanical energy conversion elements and said elastic member are shaped as circular plates with central holes, and said vibration element is provided with a pressure member that presses said vibration element against said relative movement member upon an outer circumference of said vibration element or upon an inner circumference in the central hole of said vibration element.

8. The vibration actuator of claim 7, wherein said pressure member is formed as a same member as said elastic member.

9. The vibration actuator of claim 8, wherein said pressure member supports said vibration element.

10. The vibration actuator of claim 8, wherein said pressure member comprises a projecting portion that projects from said elastic member, and said vibration element is pressed against said relative movement member by an elasticity of said projecting portion.

11. The vibration actuator of claim 2, wherein said support member is formed as a same member as said elastic member.

12. The vibration actuator of claim 11, wherein said support member supports said vibration element.

13. The vibration actuator of claim 12, wherein said vibration element is pressed by said support member.

14. The vibration actuator of claim 1, wherein
   thicknesses of each of said pair of electrical energy to mechanical energy conversion elements are equal.

15. The vibration actuator of claim 14, wherein the thickness of each of said electrical energy to mechanical energy conversion elements is between $\frac{1}{3}$ and $\frac{1}{20}$ of an overall thickness of said vibration element.

16. The vibration actuator of claim 14, wherein a structure of said vibration element, including a corresponding thickness and electrode arrangement, is upwards and downwards symmetric about a center of the corresponding thickness.

17. A vibration actuator, comprising:
   a vibration element, which simultaneously generates a radial symmetric expansion vibration mode, such that said vibration element expands and contracts in a radial direction, and a non-axisymmetric planar vibration mode, such that said vibration element bends to and fro in a non-axisymmetric manner within a same plane as said radial symmetric expansion vibration is generated, to thereby drive a relative movement member; and
   a support unit including a plurality of structural elements, which supports said vibration element, wherein said plurality of structural elements are arranged in superimposed layers with respect to said vibration element in a direction perpendicular to a vibration plane of said non axially symmetric planar vibration mode,
   wherein front and rear surfaces of an elastic member, of said vibration element, are equally deformed by a pair of electrical energy to mechanical energy conversion elements, of said vibration element.

18. The vibration actuator of claim 17, wherein said plurality of structural elements comprise:
   a support member to support said vibration element;
   an urging member to urge said vibration element using said support member; and
   a guide member to guide said support member in a predetermined direction parallel to a vibration direction in said radial symmetric expansion vibration mode and only allows displacement in the predetermined direction.

19. The vibration actuator of claim 17, wherein said support member and said urging member are provided in a space formed by projecting a vibration surface of said vibration element to a side of said support unit.

20. The vibration actuator of claim 18, wherein said urging member is provided along a plane that extends in said predetermined direction of said support member.

21. The vibration actuator of claim 20, wherein a plurality of said urging members are provided, mutually opposing one another and extending along said predetermined direction of said support member.

22. A vibration actuator, comprising:
- a vibration element formed as a circular plate with a central hole;
- a base member to which said vibration element is fixed; and
- a support member to support said vibration element at said central hole to fix said support member to said base member, wherein one side of said support member is fixed to said base member and another side of said support member is fixed to said vibration element, and
- wherein an elastic portion is provided between a portion to which said base member is fixed and a portion to which said vibration element is fixed.

23. The vibration actuator of claim 22, wherein said elastic portion is formed so that a resonance frequency ωn, determined by a mass of said vibration element and the rigidity of said elastic member, is less than a frequency ω at which said vibration element is excited.

24. The vibration actuator of claim 23, wherein said elastic portion of said support member is constricted or hollow.

25. The vibration actuator of claim 23, wherein at least said elastic portion is made of metal.

26. The vibration actuator of claim 24, wherein said vibration element comprises:
- an elastic member making up said central hole; and
- a pair of electrical energy to mechanical energy conversion elements making up said central hole, and provided upon both sides of said elastic member,
- wherein each of said pair of electrical energy to mechanical energy conversion elements include an electrode separated into two portions along a corresponding radial direction.

27. The vibration actuator of claim 26, wherein said support member and said elastic member are formed integrally as a same member.

28. A vibration actuator, comprising:
- a vibration element, which simultaneously generates a radial symmetric expansion vibration mode, such that said vibration element expands and contracts in a radial direction, and a non-axisymmetric planar vibration mode, such that said vibration element bends to and fro in a non-axisymmetric manner within a same plane as said radial symmetric expansion vibration is generated, to thereby drive a relative movement member; and
- a base member to which said vibration element is fixed,
- wherein said vibration element includes at least one superimposed layer structure having a pair of electrical energy to mechanical energy conversion elements and an elastic member sandwiched between said pair of electrical energy to mechanical energy conversion elements, with said elastic member including a ring shaped portion, each side of which one of said pair of electrical energy to mechanical energy conversion elements is stuck,
- a cylindrical shaped support portion is formed integrally with said ring shaped portion to fix said vibration element to said base member, and
- said support portion is provided with an elastic portion that suppresses a transmission of vibration generated in said vibration element to said base member.

* * * * *